(12) United States Patent
Prakash et al.

(10) Patent No.: US 11,482,289 B2
(45) Date of Patent: Oct. 25, 2022

(54) APPLICATION BASED VERIFY LEVEL OFFSETS FOR NON-VOLATILE MEMORY

(71) Applicant: SanDisk Technologies LLC, Addison, TX (US)

(72) Inventors: Abhijith Prakash, Milpitas, CA (US); Anubhav Khandelwal, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 17/192,090

(22) Filed: Mar. 4, 2021

(65) Prior Publication Data
US 2022/0284971 A1  Sep. 8, 2022

(51) Int. Cl.
| | | |
|---|---|---|
| *G11C 16/04* | (2006.01) | |
| *G11C 16/06* | (2006.01) | |
| *G11C 11/56* | (2006.01) | |
| *G11C 16/34* | (2006.01) | |
| *G11C 16/28* | (2006.01) | |
| *G11C 16/10* | (2006.01) | |
| *G11C 16/30* | (2006.01) | |
| *G11C 16/26* | (2006.01) | |
| *G11C 16/08* | (2006.01) | |

(52) U.S. Cl.
CPC .......... *G11C 16/3459* (2013.01); *G11C 16/08* (2013.01); *G11C 16/10* (2013.01); *G11C 16/26* (2013.01); *G11C 16/30* (2013.01); *G11C 16/3404* (2013.01)

(58) Field of Classification Search
CPC ..... G11C 16/3459; G11C 16/08; G11C 16/10; G11C 16/26; G11C 16/30; G11C 16/3404
USPC ...................................................... 365/185.22
See application file for complete search history.

(56) References Cited

U.S. PATENT DOCUMENTS

| | | | |
|---|---|---|---|
| 8,009,472 B2 | 8/2011 | Murin et al. | |
| 9,343,156 B1* | 5/2016 | Mui ................. | G11C 29/50012 |
| 10,026,486 B1 | 7/2018 | Dutta et al. | |
| 10,705,900 B2* | 7/2020 | Jin ....................... | G06F 11/0754 |
| 2012/0218823 A1* | 8/2012 | Tanzawa ................ | G11C 16/26 |
| | | | 365/185.18 |
| 2013/0016565 A1* | 1/2013 | Park ..................... | G11C 11/5628 |
| | | | 365/185.22 |
| 2014/0219027 A1* | 8/2014 | Dong .................. | G11C 16/3454 |
| | | | 365/185.17 |

(Continued)

*Primary Examiner* — Ly D Pham
(74) *Attorney, Agent, or Firm* — Dickinson Wright PLLC; Steven C. Hurles

(57) ABSTRACT

A memory apparatus and method of operation are provided. The apparatus includes a plurality of memory cells. Each of the plurality of memory cells is connected to one of a plurality of word lines and is arranged in one of a plurality of blocks. Each of the plurality of memory cells is configured to retain a threshold voltage corresponding to one of a plurality of data states. A control circuit is coupled to the plurality of word lines and is configured to detect at least one use characteristic of the memory apparatus. The control circuit adjusts a verify voltage level by one of a plurality of verify level offsets based on the at least one use characteristic that is detected. The verify voltage level is applied to the one of the plurality of word lines selected for programming following an application of a program voltage during a program operation.

17 Claims, 18 Drawing Sheets

(56) References Cited

U.S. PATENT DOCUMENTS

| | | | |
|---|---|---|---|
| 2014/0269090 A1* | 9/2014 | Flynn | G11C 16/3495 365/185.24 |
| 2017/0242632 A1* | 8/2017 | Cho | G06F 16/902 |
| 2020/0365220 A1* | 11/2020 | Yang | G11C 16/3486 |
| 2020/0395088 A1* | 12/2020 | Cho | G11C 16/10 |
| 2021/0225450 A1* | 7/2021 | Park | G11C 16/26 |
| 2021/0391025 A1* | 12/2021 | Masuduzzaman | G11C 16/3427 |
| 2022/0020441 A1* | 1/2022 | Hwang | G11C 16/3459 |

* cited by examiner

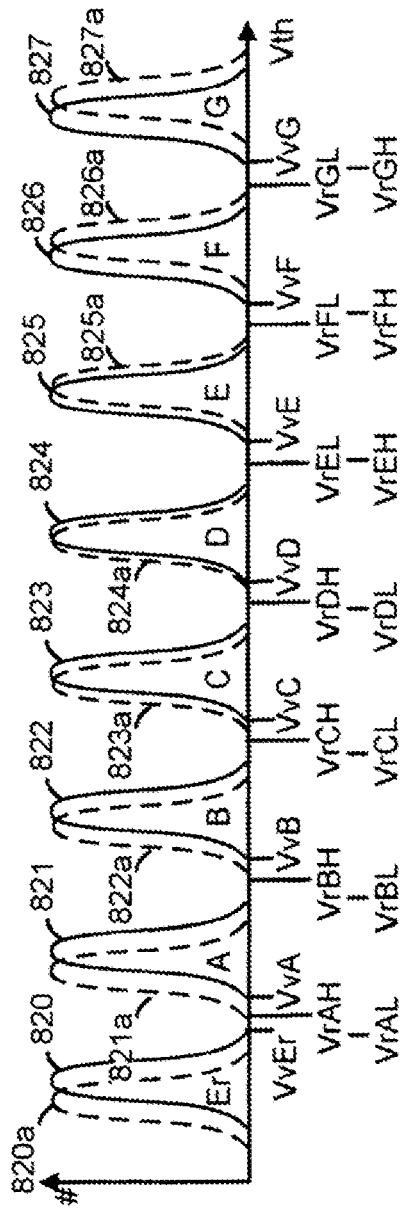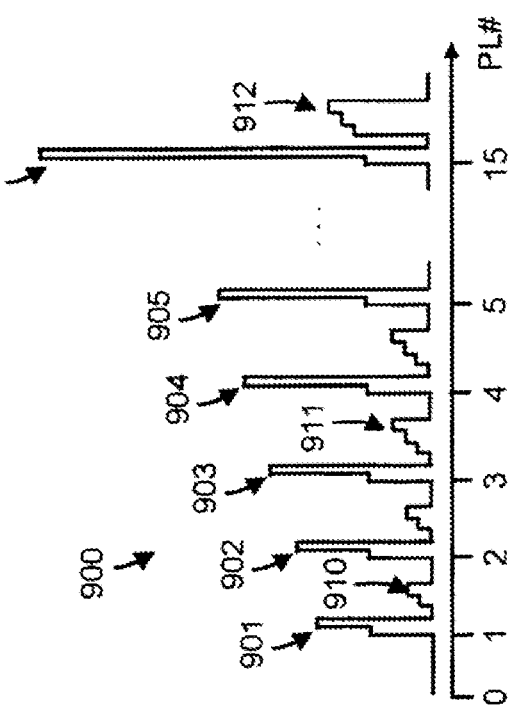

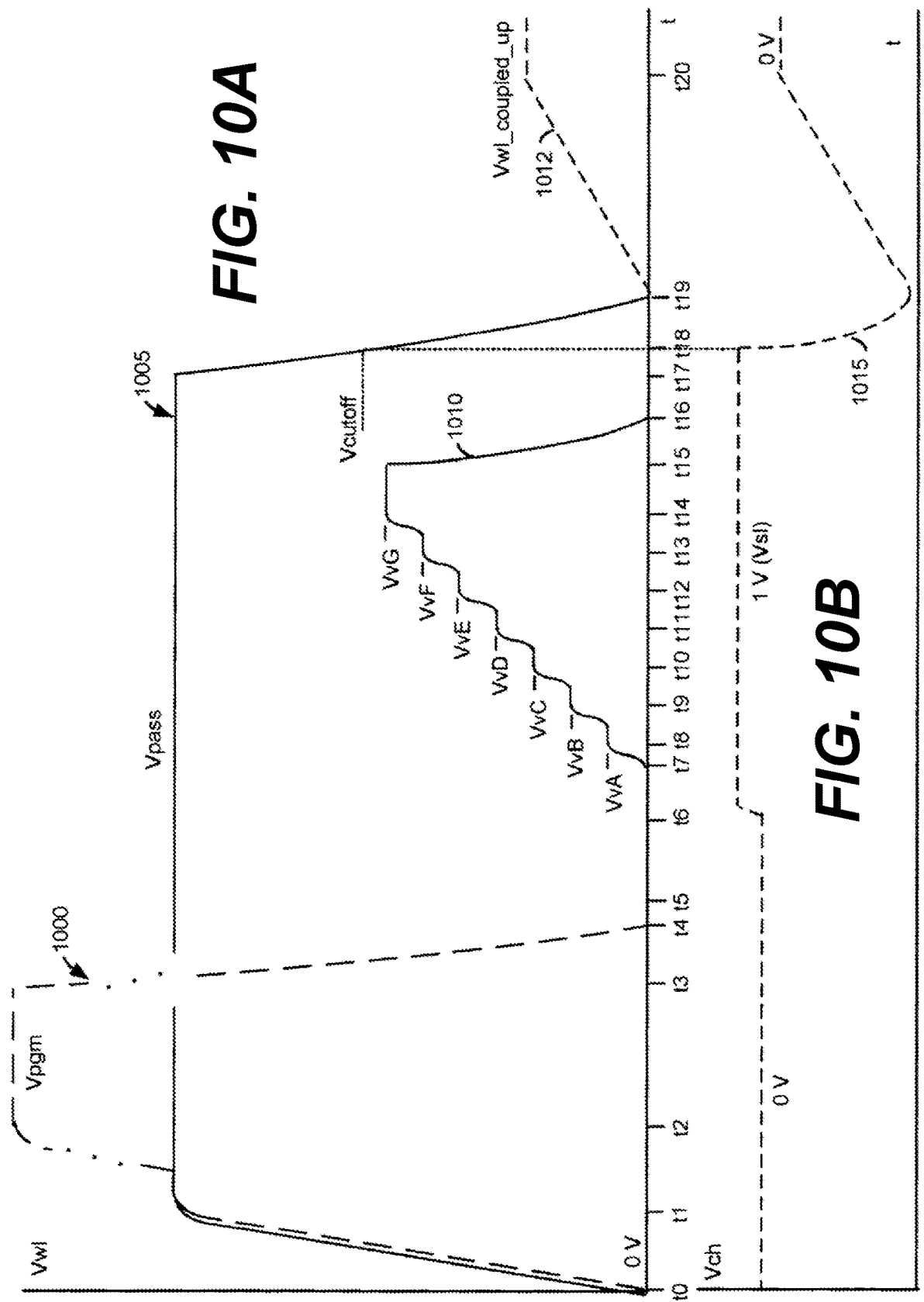

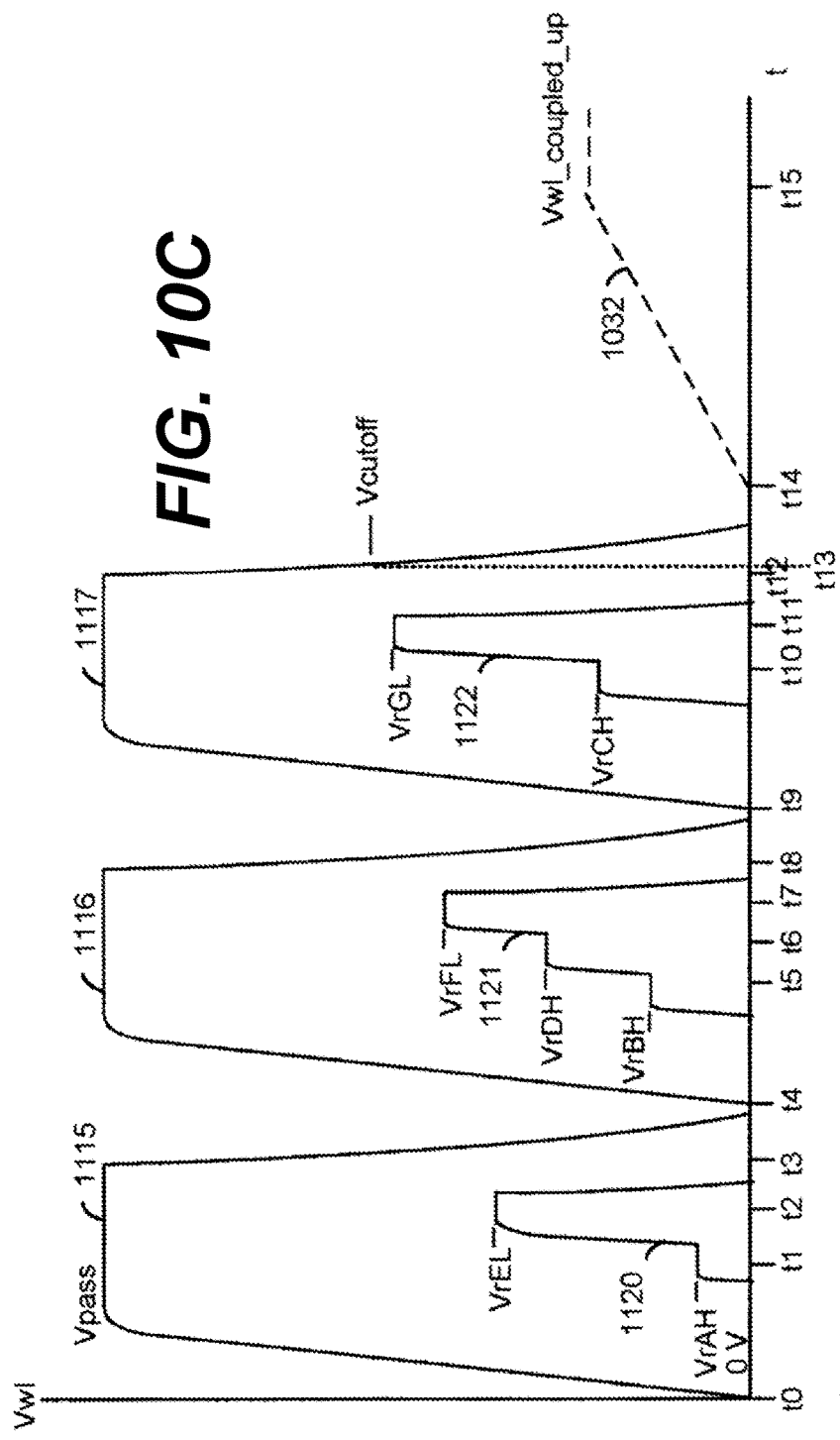
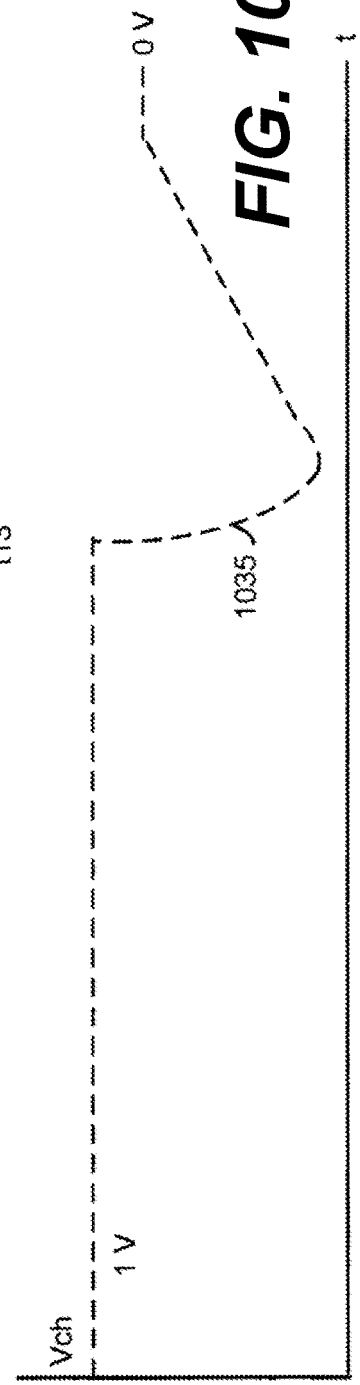

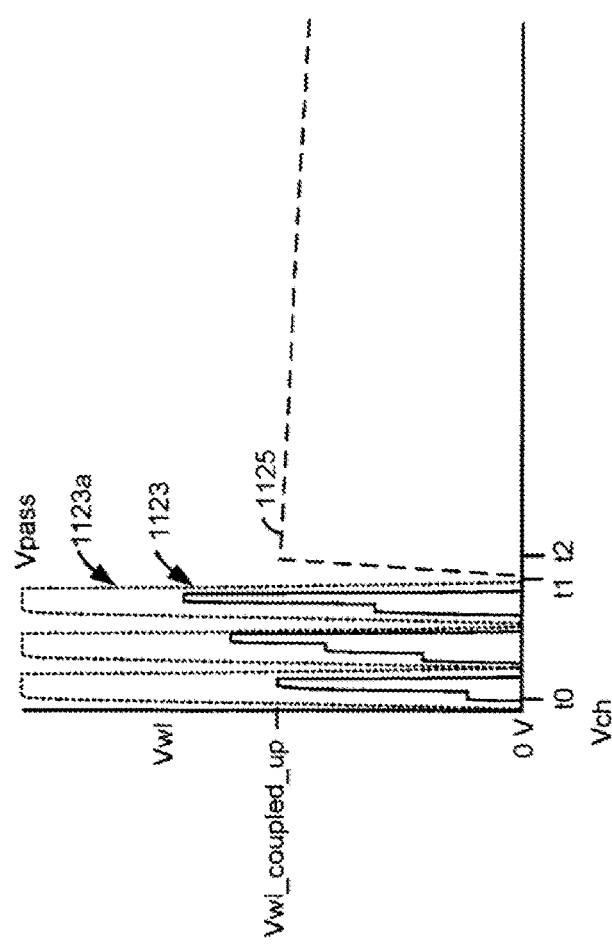
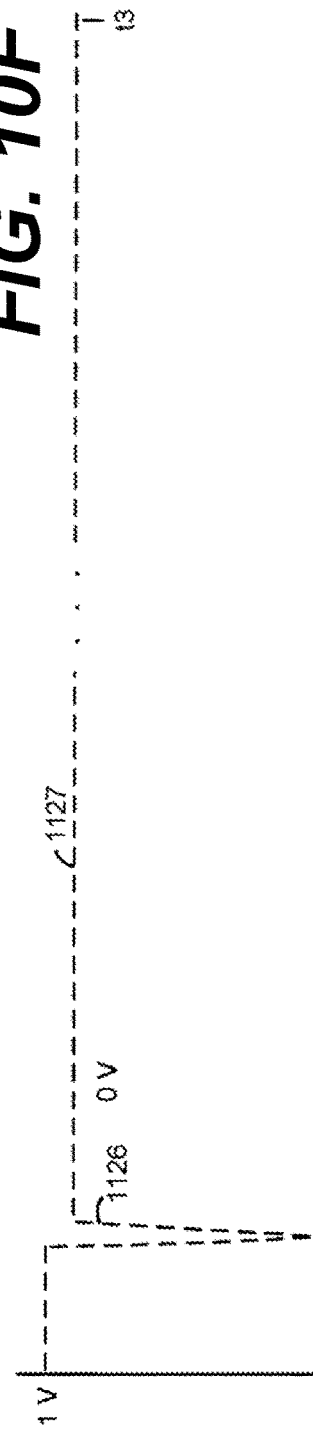
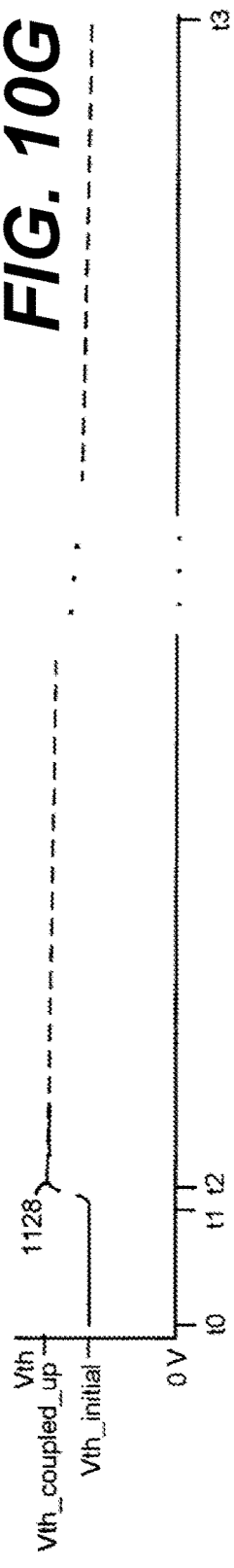
FIG. 10E
FIG. 10F
FIG. 10G

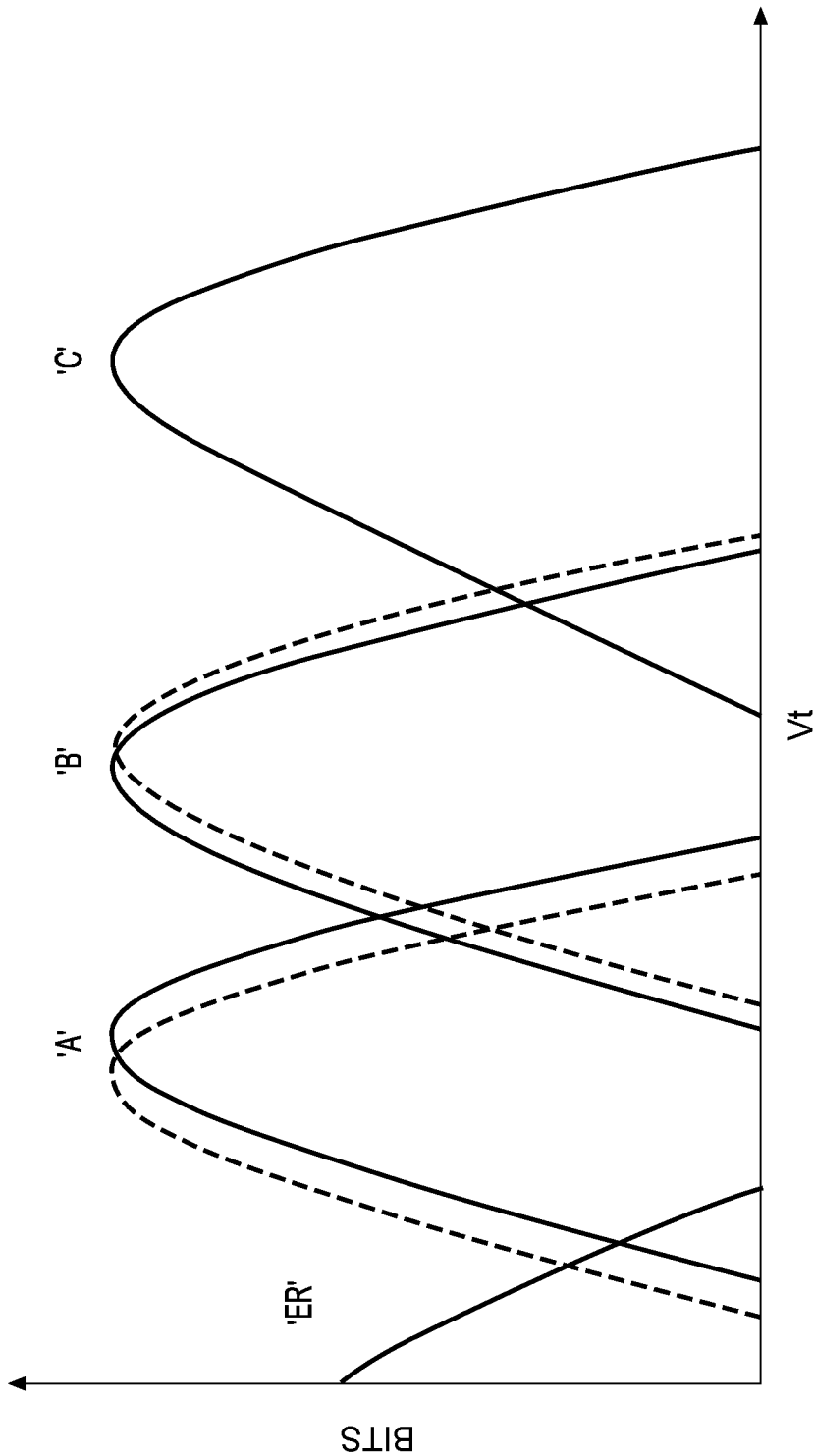

APPLICATION BASED VERIFY LEVEL OFFSETS FOR NON-VOLATILE MEMORY

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a plurality of memory cells. Each of the plurality of memory cells is connected to one of a plurality of word lines and is arranged in one of a plurality of blocks. Each of the plurality of memory cells is configured to retain a threshold voltage corresponding to one of a plurality of data states. The apparatus also includes a control circuit coupled to the plurality of word lines and configured to detect at least one use characteristic of the memory apparatus. The control circuit is also configured to adjust a verify voltage by one of a plurality of verify level offsets based on the at least one use characteristic of the memory apparatus detected. The verify voltage is applied to the one of the plurality of word lines selected for programming following an application of a program voltage during a program operation.

According to another aspect of the disclosure, a controller in communication with a memory apparatus including a plurality of memory cells is also provided. Each of the plurality of memory cells is connected to one of a plurality of word lines and is arranged in one of a plurality of blocks and configured to retain a threshold voltage corresponding to one of a plurality of data states. The controller is configured to detect at least one use characteristic of the memory apparatus. The controller is also configured to adjust a verify voltage by one of a plurality of verify level offsets based on the at least one use characteristic of the memory apparatus detected. The verify voltage is applied to the one of the plurality of word lines selected for programming following an application of a program voltage during a program operation.

According to an additional aspect of the disclosure a method of operating a memory apparatus is provided. The memory apparatus includes a plurality of memory cells, each of the plurality of memory cells connected to one of a plurality of word lines and arranged in one of a plurality of blocks and configured to retain a threshold voltage corresponding to one of a plurality of data states. The method includes the step of detecting at least one use characteristic of the memory apparatus. The method also includes the step of adjusting a verify voltage by one of a plurality of verify level offsets based on the at least one use characteristic of the memory apparatus detected. The verify voltage is applied to the one of the plurality of word lines selected for programming following an application of a program voltage during a program operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 8A depicts an example threshold voltage (Vth) distribution of memory cells, where eight data states are used, in a first read condition compared to a second read condition according to aspects of the disclosure;

FIG. 8B depicts example bit sequences for lower, middle and upper pages of data, and associated read voltages, for the Vth distributions of FIG. 8A according to aspects of the disclosure;

FIG. 9 depicts a waveform of an example programming operation according to aspects of the disclosure;

FIG. 10A depicts a plot of example waveforms in a programming operation, showing coupling up of a word line voltage according to aspects of the disclosure;

FIG. 10B depicts a plot of a channel voltage (Vch) corresponding to FIG. 10 according to aspects of the disclosure;

FIG. 10C depicts a plot of example waveforms in a read operation, showing coupling up of a word line voltage according to aspects of the disclosure;

FIG. 10D depicts a plot of a channel voltage (Vch) corresponding to FIG. 10C according to aspects of the disclosure;

FIG. 10E depicts the waveforms of FIG. 10C showing a decay of the coupled up voltage of the word line according to aspects of the disclosure;

FIG. 10F depicts a plot of a channel voltage consistent with FIG. 10E according to aspects of the disclosure;

FIG. 10G depicts a plot of a Vth of a memory cell connected to the coupled up word line, consistent with FIGS. 10E and 10F according to aspects of the disclosure;

FIG. 12 shows threshold voltage distributions with different verify levels for two states in an example memory apparatus according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
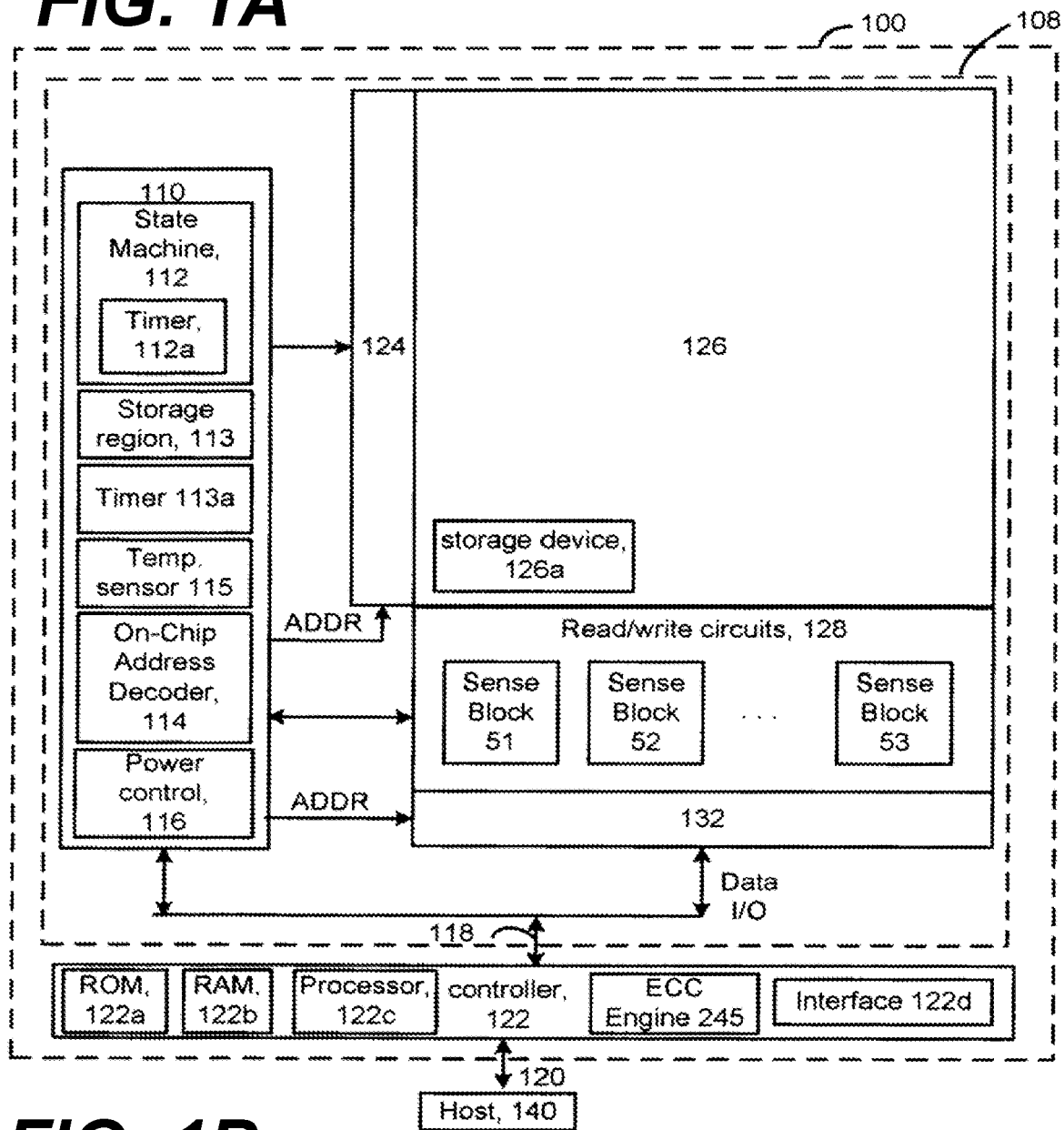
FIG. 1A is a block diagram of an example memory apparatus or device according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8A). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can vary depending on when the read operation occurs. For example, the Vth can vary in the memory cells depending on a coupled up state of the word lines when the read operation occurs. A "first read" condition can be defined in which the word lines are not coupled up, and a "second read" condition can be defined in which the word lines are coupled up.

The memory cells can be in the first read condition after a power on event in the memory device. When the memory device is powered up for use, an operation may occur which checks for bad blocks. This operation involves applying 0 V or other low voltage to the word lines. As a result, any coupling up of the word line voltages is discharged.

The word lines can also be discharged in a block when the word line voltages are set to a low level. This can occur when the block is inactive while an operation is performed in another block. The cells can also be in the first read condition after a significant amount of time has passed after a last sensing operation, since the word lines discharge over time. The coupling up of the word lines causes a Vth shift in the cells due to inadvertent programming or erasing. Since the word lines are not significantly coupled up while in the first read condition, this Vth does not occur.

The cells can be in the second read condition when the read occurs shortly, e.g., seconds or minutes, after a last sensing operation. Since the word lines are relatively strongly coupled up while in the second read condition, there is a programming or erasing of the cells due to the word line voltage, and a corresponding shift in the Vth. In particular, the word lines with a coupled-up voltage can cause weak programming of cells which have a relatively low Vth, lower than the coupled-up voltage, e.g., cells in lower programmed data states, thus resulting in a Vth upshift for these cells. Also, there can be a weak erasing of cells which have a relatively high Vth, higher than the coupled-up voltage, e.g., cells in higher programmed data states, thus resulting in a Vth downshift for these cells.

The cells gradually transition from the second read condition to the first read condition over time, e.g., one hour, as the word lines are discharged. The coupling up of the word line voltage is caused by the voltages of a sensing operation such as a verify operation which occurs in connection with a programming operation, or a read operation which occurs after a programming operation is completed. The sensing of the cells involves the application of a sensing voltage (e.g., a read/verify voltage) to a selected word line. The coupling up of the word line voltage affects data retention which often determines an upper limit of threshold voltage Vt widths for all the data states right after programming. Data retention requirements and apparatus capabilities may therefore affect programming time or performance, as well as fail bit counts. Techniques provided herein address the above and other issues.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a clock 112a to determine an elapsed time since a last sensing operation, as discussed further below. A storage region 113 may be provided, e.g., for sets of read voltage and/or a plurality of verify level offsets, as described further below. Generally, the storage region may store operational parameters and software/code. A timer 113a may also be used to determine timing of predetermined refresh read voltage pulses to word lines and/or a power on time in which the memory apparatus is supplied with the electrical power, described in more detail below, for example. A temperature sensor 115 may also be provided.

In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122 d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
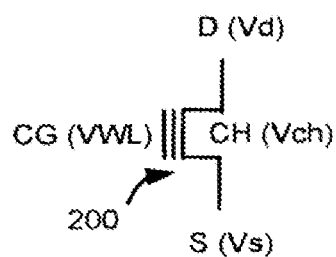
FIG. 1B depicts an example memory cell according to aspects of the disclosure.

FIG. 1B depicts an example memory cell 200. The memory cell comprises a control gate CG which receives a word line voltage Vwl, a drain at a voltage Vd, a source at a voltage Vs and a channel at a voltage Vch.

Figure 1C:
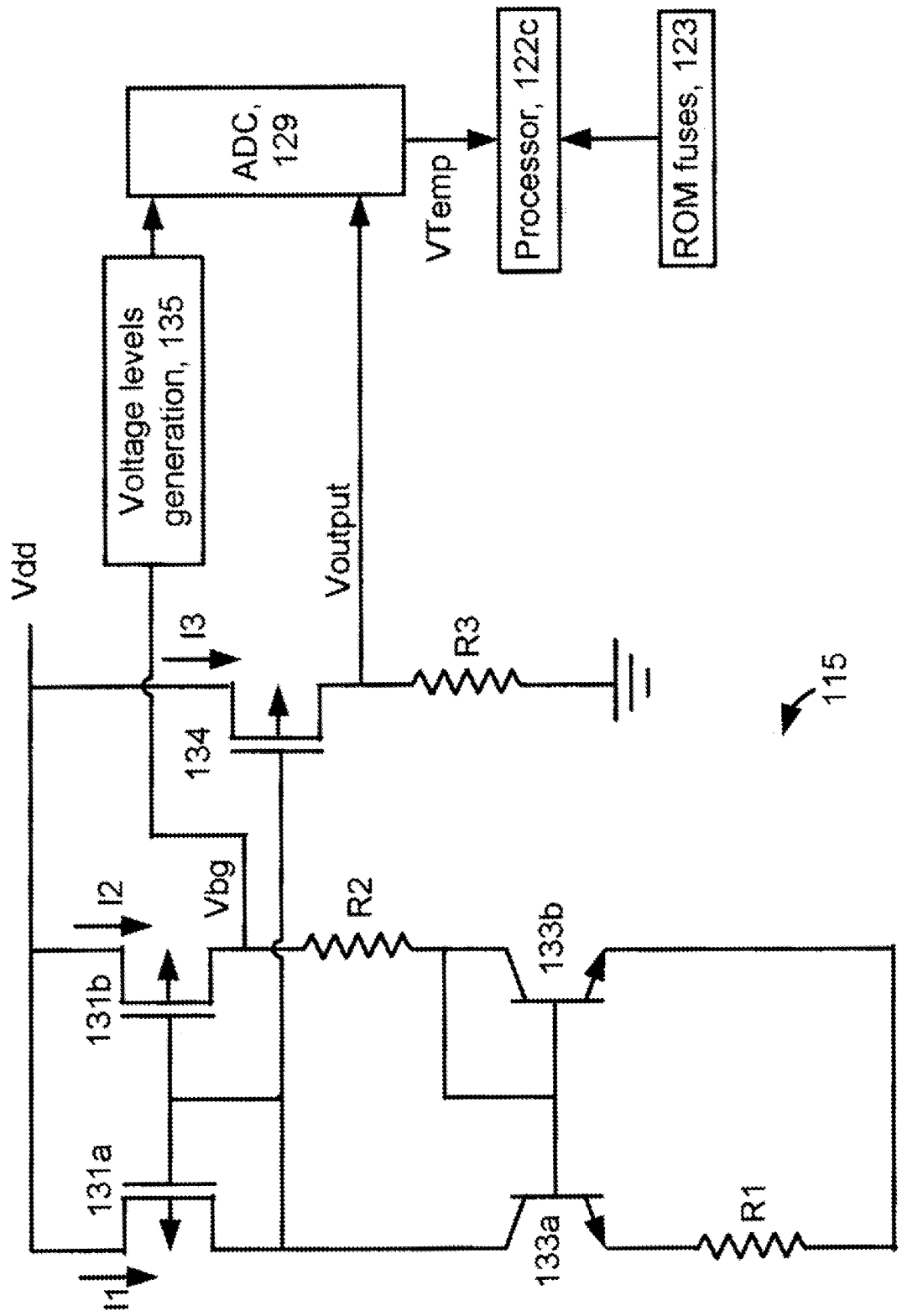
FIG. 1C depicts an example of the temperature-sensing circuit of FIG. 1A according to aspects of the disclosure.

FIG. 1C depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
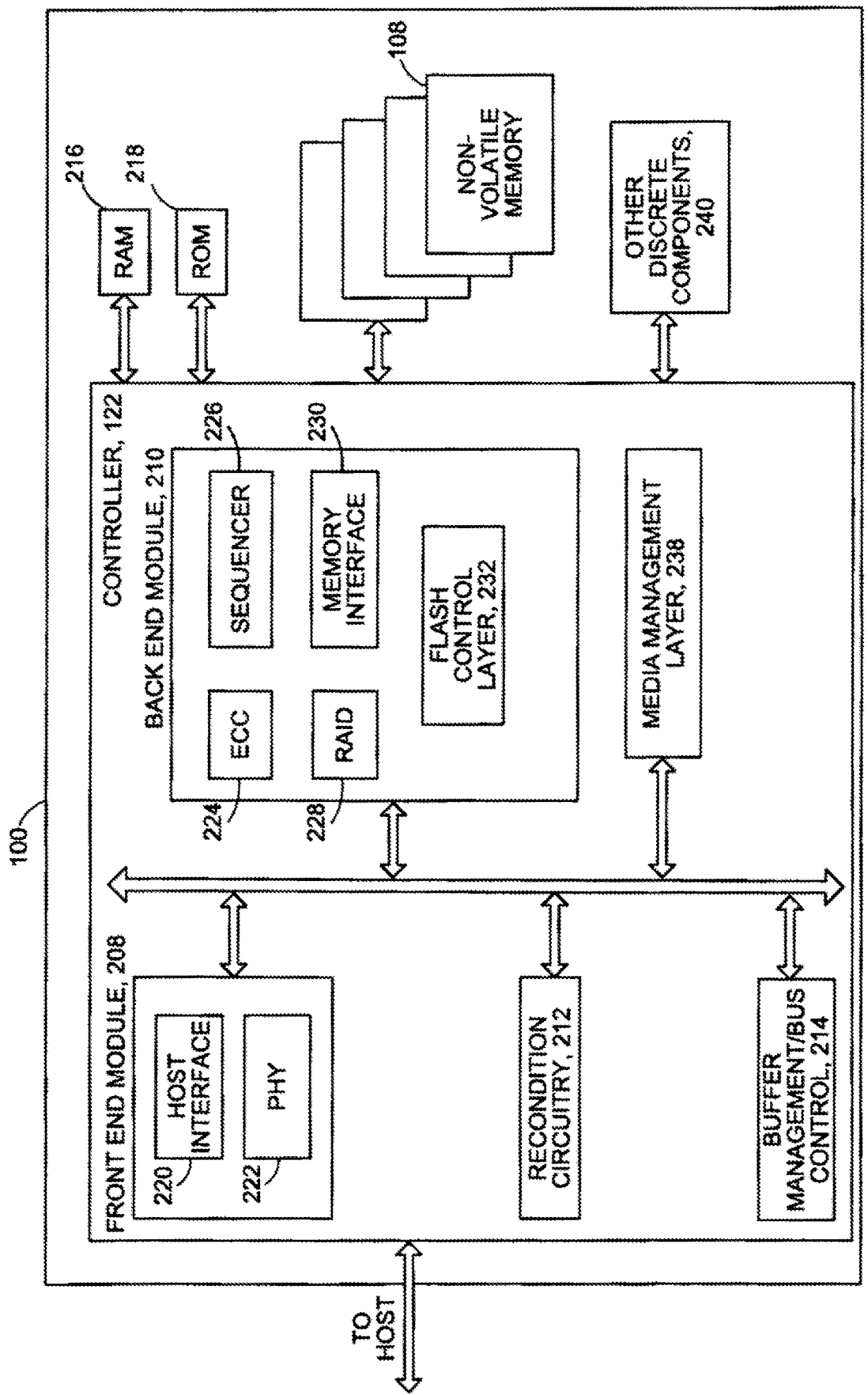
FIG. 2 is a block diagram of the example memory device, depicting additional details of the controller according to aspects of the disclosure.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1A (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
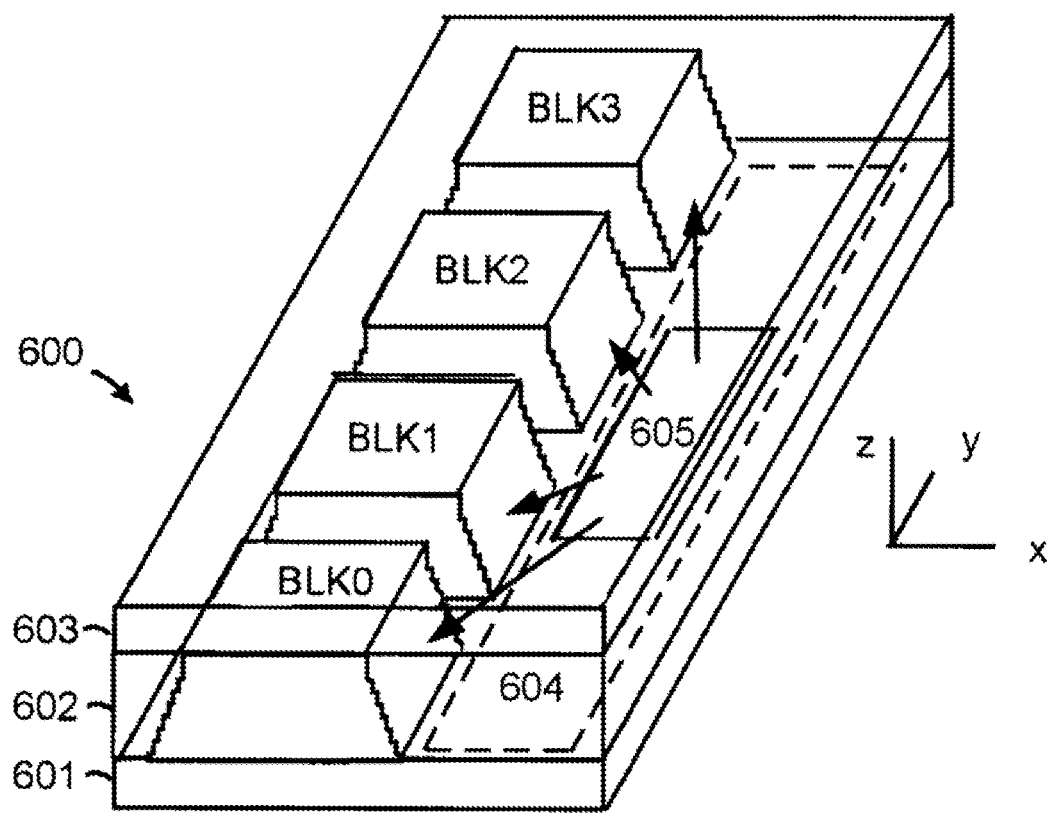
FIG. 3 is a perspective view of a memory device comprising a set of blocks in an example 3D configuration of the memory structure of FIG. 1 according to aspects of the disclosure.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
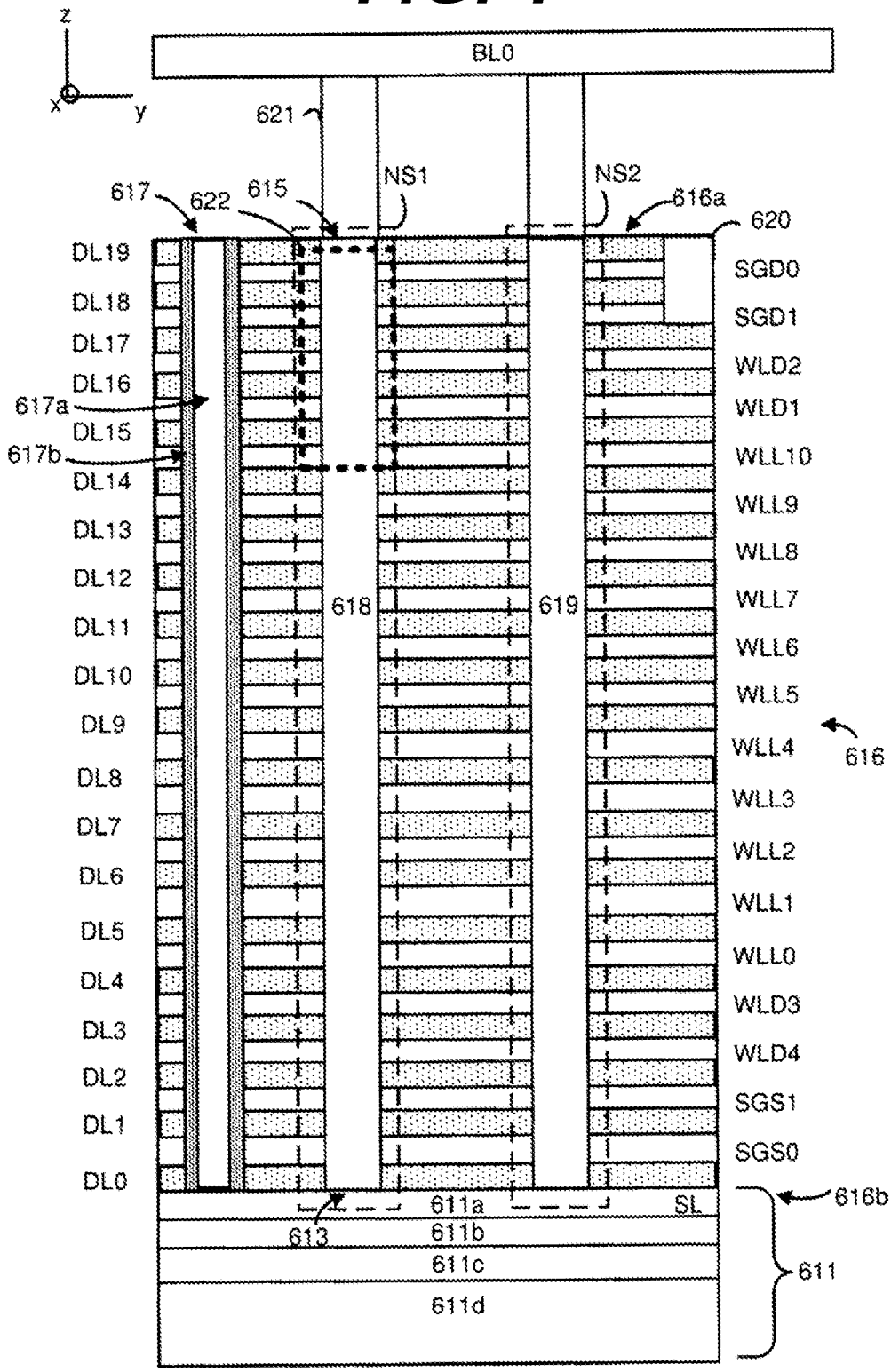
FIG. 4 depicts an example cross-sectional view of a portion of one of the blocks of FIG. 3 according to aspects of the disclosure.

FIG. 4 depicts an example cross-sectional view of a portion of one of the blocks of FIG. 3. The block comprises a stack 616 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack and a drain-end 615 at a top 616a of the stack. Local interconnects, such as local interconnect 617, may be provided periodically across the stack. The local interconnects may be metal-filled slits which extend through the stack, such as to connect the source line/substrate to a line above the stack. The slits may be used during the formation of the word lines and subsequently filled with metal. The local interconnect comprises a conductive region 617a (e.g., metal) within an insulating region 617b. A portion of a bit line BL0 is also depicted. A conductive via 621 connects the drain-end 615 of NS1 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

An insulating region 620 may be provided to separate portions of the SGD layers from one another to provide one independently driven SGD line per sub-block. In this example, the word line layers are common to two adjacent sub-blocks. See also FIG. 7B. In another possible implementation, the insulating region 620 extends down to the substrate to separate the word line layers. In this case, the word line layers are separate in each sub-block. Although, in either case, the word line layers of a block can be joined at their ends to one another so that they are commonly driven within a block, as depicted in FIG. 7B.

Figure 5:
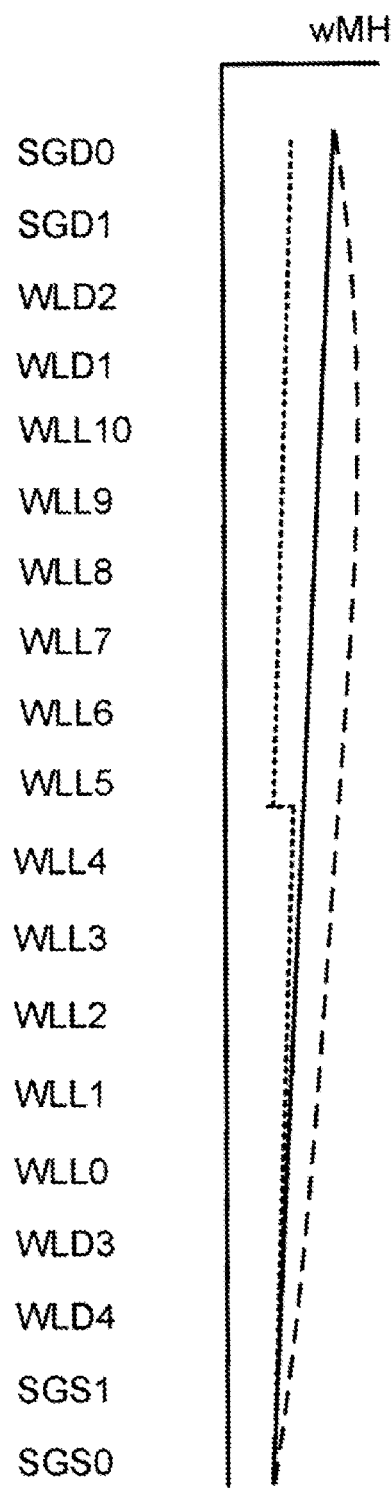
FIG. 5 depicts a plot of memory hole/pillar diameter in the stack of FIG. 4 according to aspects of the disclosure.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes. The amount of word line coupling up and discharge is therefore relatively larger than for memory cells in word lines adjacent to the relatively larger diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
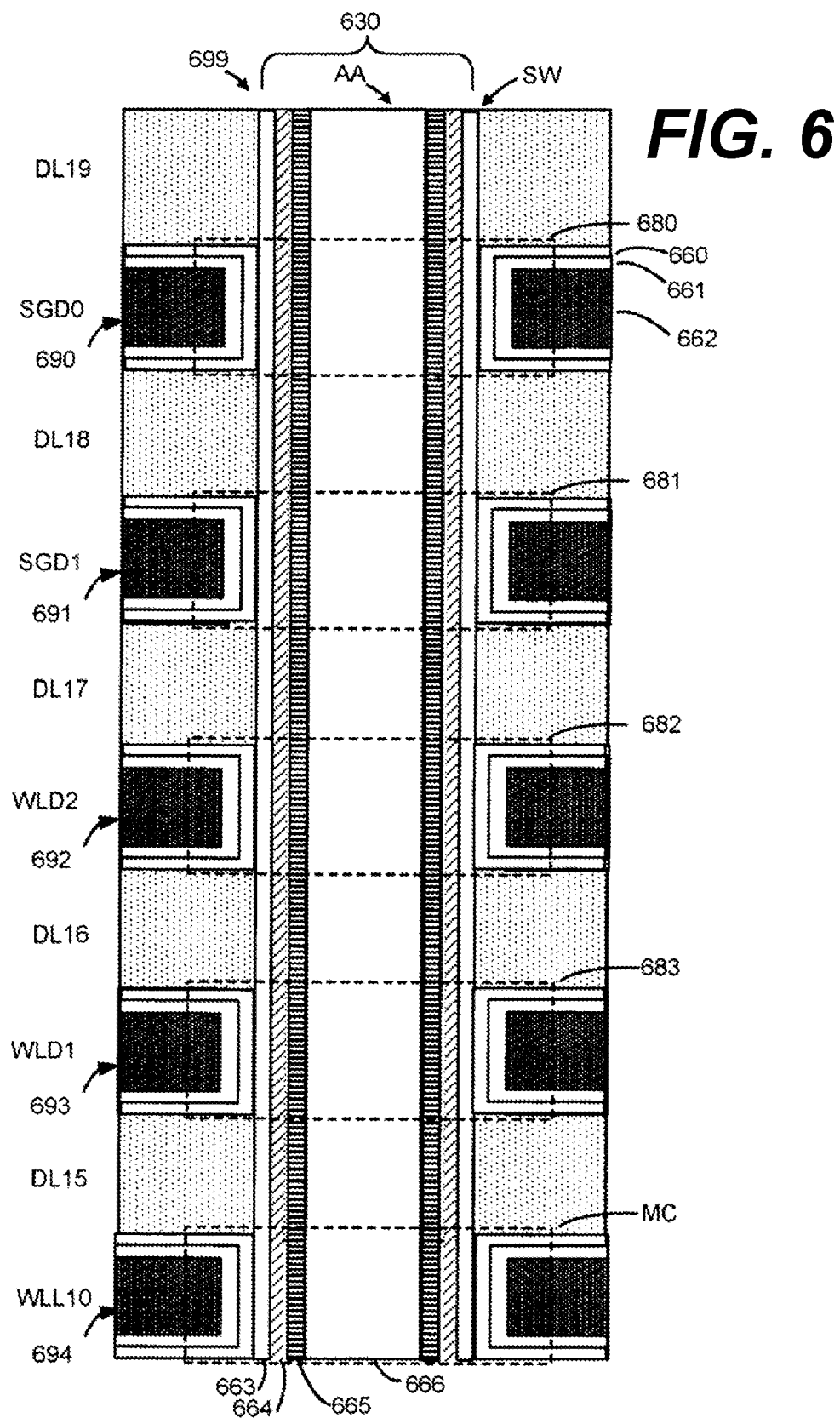
FIG. 6 depicts a close-up view of a region of the stack of FIG. 4 according to aspects of the disclosure.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664 (tunnel oxide), a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
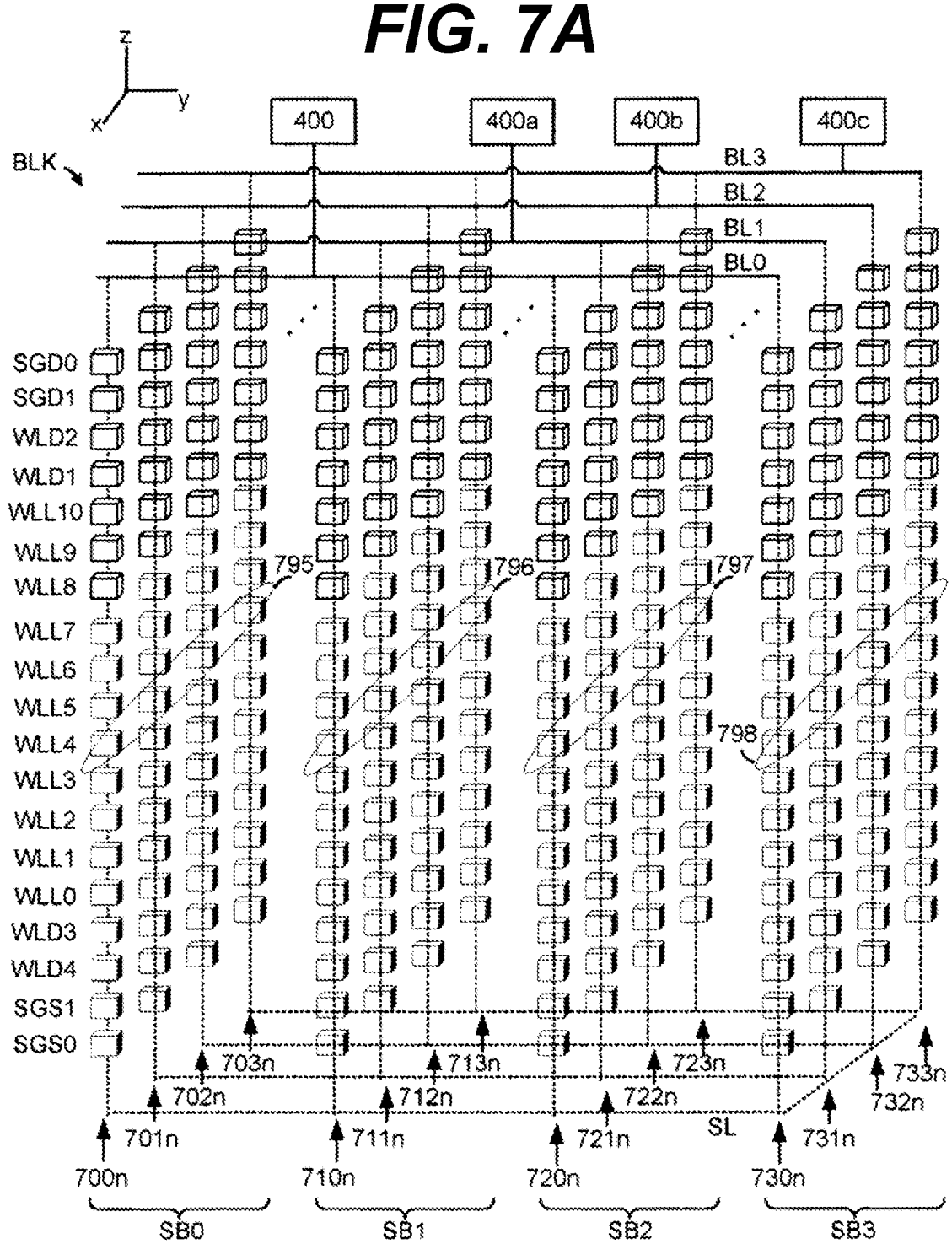
FIG. 7A depicts an example view of NAND strings in sub-blocks in a 3D configuration which is consistent with FIG. 4 according to aspects of the disclosure.
Figure 7B:
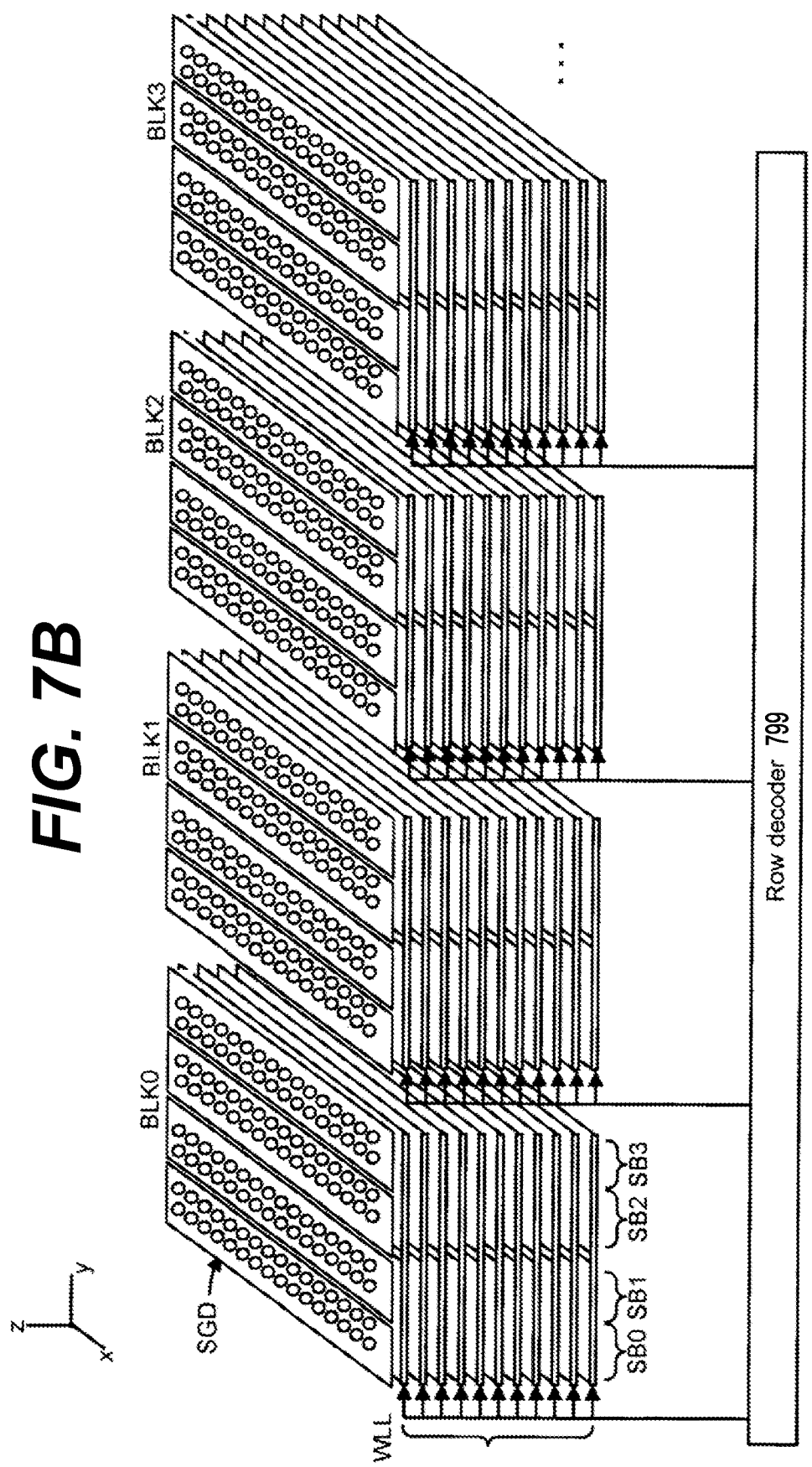
FIG. 7B depicts word line and SGD layers in an example set of blocks which is consistent with FIG. 4 according to aspects of the disclosure.

FIG. 7A depicts an example view of NAND strings in sub-blocks in a 3D configuration which is consistent with FIG. 4. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings, e.g., vertical strings, which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

FIG. 7B depicts word line and SGD layers in an example set of blocks which is consistent with FIG. 4. Blocks BLK0, BLK1, BLK2 and BLK3 are depicted. The word line layers (WLL) in each block are depicted and long with example SGD lines. One SGD line is provided in each sub-block. BLK0 includes sub-blocks SB0, SB1, SB2 and SB3. Each circle represents a memory hole or string. The sub-blocks are elongated in the x direction and contain thousands of memory strings in practice. Additionally, many more blocks beyond those depicted are arranged in a row on the substrate. The word line layers and SGD/SGS layers may receive voltages from a row decoder 799.

FIG. 8A depicts an example Vth distribution of memory cells, where eight data states are used, in a first read condition compared to a second read condition. Eight data states are an example only as other numbers may be used such as four, sixteen or more. For the Er, A, B, C, D, E, F and G states, we have Vth distributions 820, 821, 822, 823, 824, 825, 826 and 827, respectively, in the second read condition, and 820a, 821a, 822a, 823a, 824a, 825a, 826a and 827a, respectively, in the first read condition. For the A, B, C, D, E, F and G states, we have program verify voltages VvA, VvB, VvC, VvD, VvE, VvF and VvG, respectively. Also depicted are read voltages VrAH, VrBH, VrCH, VrDH, VrEL, VrFL and VrGL, respectively, in the second read condition, and read voltages VrAL, VrBL, VrCL, VrDL, VrEH, VrFH and VrGH, respectively, in the first read condition. Also depicted is an example encoding of bits of 111, 110, 100, 000, 010, 011, 001 and 101, respectively. The bit format is: UP/MP/LP. An erase verify voltage VvEr is used during an erase operation.

This example indicates the shift in the Vth distribution for the first read condition compared to the second read condition is relatively larger when the data state is relatively lower or higher, than when the data state is mid-range. The shift may be progressively larger for progressively lower or higher data states. In one example, the read voltages of VrAL, VrBL, VrCL and VrDL are optimal for the relatively lower states of A, B, C and D, respectively, and the read voltages of VrEH, VrFH and VrGH are optimal for the relatively higher states of E, F and G, respectively, in the first read condition. Similarly, the read voltages of VrAH, VrBH, VrCH and VrDH are optimal for the relatively lower states of A, B, C and D, respectively, and the read voltages of VrEL, VrFL and VrGL are optimal for the relatively higher states of E, F and G, respectively, in the second read condition. Thus, the lower of two read voltages per state is optimal in the first read condition for the lower states and the higher of two read voltages per state is optimal in the first read condition for the higher states, in one possible implementation.

The optimum read voltages generally are midway between the Vth distributions of adjacent data states. Accordingly, as the Vth distribution shifts, the optimum read voltages shift.

The first read condition can occur when there is a long delay since a last programming or read operation. An example sequence is: program a block, wait for one hour, then read the block. The first read condition can also occur when there is a power down/power up. An example sequence is: program a block, power down/power up, then read the block. The first read condition can also occur when there is a program or read of other blocks. An example sequence is: program one block, program another block, then read the one block.

FIG. 8B depicts example bit sequences for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to 0 between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG. The read voltages are depicted as VrA, VrB, VrC, VrD, VrE, VrF and VrG, where each of these can represent the first or second read values, whichever is optimal.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A depicts a plot of example waveforms in a programming operation, showing coupling up of a word line voltage. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. The program voltage can temporarily pause at an intermediate level such as Vpass to avoid a single large transition which can have undesired coupling effects. A pass voltage 1005 is applied to the unselected word lines from t0-t19 and reaches a magnitude of Vpass, which is sufficiently high to provide the cells in a conductive state so that the sensing (e.g., verify) operations can occur for the cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, the decrease in Vpass will cause the cells to transition from a conductive state to a non-conductive state. In particular, when the Vpass falls below a cutoff level, Vcutoff (the dotted line at t18), the channel of the cell will become cutoff, e.g., the cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the cell (the word line voltage), Vth is the threshold voltage of the cell and Vsl is the source line voltage which in turn is approximately the voltage at the source terminal of the cell. For a cell in the highest programmed state, e.g., the G state, the Vth can be as low as VvG (or lower due to post-programming charge loss) and as high as the Vth at the upper tail of the G state in the Vth distribution 827 or 827a in FIG. 8A. Vcutoff can therefore be as low as VvG+Vsl or as high as Vth of G state upper tail+Vsl. As the pass voltage 1005 decreases from Vcutoff to 0 V, the channel is capacitively coupled down by a similar amount, as represented by plot 1015 in FIG. 10B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1012 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 10B depicts a plot of a channel voltage (Vch) corresponding to FIG. 10A. For an unselected memory string (a string not having a cell which is programmed in the current program loop), Vch will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected memory string (a string having a cell which is programmed in the current program loop), Vch is typically grounded as shown during the program voltage.

During the verify voltages, Vch may be initially at about 1 V, for instance, for a selected memory string. Vch is about the same as Vsl for the channels of the selected memory strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1012) are capacitively coupled higher by the increase in Vch. The voltages of the word lines float to a peak level of Vwl_coupled_up, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1−6×0.9=−4.4 V, for instance. Accordingly, there is a 4.4 V increase in Vch which is coupled to the word line, e.g., control gate, of the cells. Vwl_coupled_up may be about 4.4×0.9=4 V. The voltages of the word lines are floated by disconnected the word lines from a word line driver.

FIG. 10C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages 1115, 1116 and 1117 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1120 (at levels of VrAH and VrEL), 1121 (at levels of VrBH, VrDH and VrFL) and 1122 (at levels of VrCH and VrGL) for each of the lower, middle and upper pages, respectively, consistent with FIGS. 8A and 8B. The read voltages are optimized for the second read condition, as an example, and are applied to the selected word line. An eight-level memory device is used in this example.

For the unselected word lines, the decrease in Vpass will cause the cells to transition from a conductive state to a non-conductive state, as discussed. The dotted line at t13 indicates when a G state cell becomes non-conductive. As the pass voltage 1117 decreases from Vcutoff to 0 V, the channel is capacitively coupled down by a similar amount, as represented by the plot 1035 in FIG. 10D. As the channel voltage increases after t14, the word line voltages are floated and are coupled higher, to Vwl_coupled_up.

FIG. 10D depicts a plot of a channel voltage (Vch) corresponding to FIG. 10C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1032) are capacitively coupled higher by the increase in Vch (plot 1035). The voltages of the word lines float to a peak level of Vwl_coupled_up, as discussed.

FIG. 10E depicts the waveforms of FIG. 10C showing a decay of the coupled up voltage of the word line. The time scale is different than in FIGS. 10A-10D and represents a longer time period such as one or more hours. The plot 1123 depicts the read voltages (corresponding to the waveforms 1120-1122 in FIG. 10C) in a time period t041. The plot 1123a depicts the pass voltages (corresponding to the waveforms 1115-1117 in FIG. 10C). A plot 1125 depicts an increase in Vwl to a coupled up level (Vwl_coupled_up) due to coupling (in a time period t1-t2) followed by a decay of Vwl in a time period t2-t3. Generally, the increase in Vwl occurs relatively quickly compared to the time period of the decay.

FIG. 10F depicts a plot of a channel voltage consistent with FIG. 10E. A decrease is followed by an increase (plot 1126) in the time period t1-t2. Vch is about 0 V from t2-t3 (plot 1127).

FIG. 10G depicts a plot of a Vth of a memory cell connected to the coupled up word line, consistent with FIGS. 10E and 10F. For a cell in an example data state, such as the A state, the Vth is at an initial level, Vth_initial, from t0-t1. This represents the first read condition. Vth increases from t1-t2 (plot 1128) due to coupling at the same time as the increase in Vch, to a peak level of Vth_coupled_up. This represents the second read condition. The Vth then gradually decreases back to Vth_initial from t1-t3.

Figure 11A:
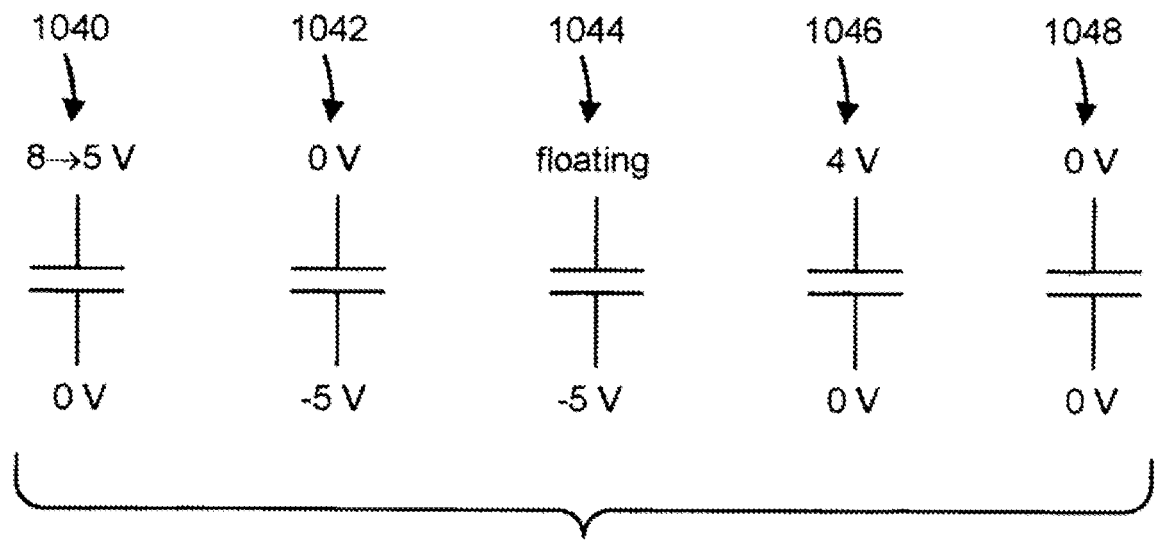
FIG. 11A depicts control gate and channel voltages on a memory cell which acts as a capacitor when the control gate voltage is decreased in a sensing operation according to aspects of the disclosure.

FIG. 11A depicts control gate and channel voltages on a memory cell which acts as a capacitor when the control gate voltage is decreased in a sensing operation. The first read issue is caused by the stacking of word line planes or layers in 3D, where the channels of the memory cells are floating and not coupled to the substrate as in 2D Flash NAND architectures. Word line coupling and electron trapping in oxide-nitride-oxide (ONO) layers are the sources of the first read issue.

As discussed, after a read/verify operation, when the read pass voltage (Vpass) applied on a word line ramps down, the G-state cells, for example, with Vth of 5 V, cut off the channel when Vpass reduces to 5 V. The floating channel potential then is pushed down to a negative value when Vpass is further reduced to Vss. Next, the negative voltage in the channel shown above (about −4.5 V) increases after the read operation finishes by attracting positive charges. Since the data word lines are floating, the amount of holes needed to charge up the channel is relatively small, so the selected and unselected word lines can be quickly coupled up to around 4 V (assuming a coupling ratio of 90%). The potential on the word lines remains at about 4 V for a while. This attracts and traps electron in the tunnel ONO layers and causes a Vth upshift or downshift for the lower or higher data states, respectively. The word line voltage thus rises to about 4 V after the read operation due to the coupling of the word line to the floating channel potential.

The top plate represents the control gate or word line and the bottom plate represents the channel. The capacitor 1040 represents a memory cell when the word line voltage decreases from 8 V (Vpass) to 5 V (Vcutoff such as VvG or slightly higher) and Vch=0 V. The capacitor 1042 represents a memory cell when the word line voltage reaches 0 V, so that Vch is down coupled to about −4.5 V. The capacitor 1044 represents a memory cell when the associated word line voltage starts to float. The capacitor 1046 represents a memory cell when the associated word line voltage reaches Vwl_coupled_up in the second read condition. If the Vth of the memory cell is less than 4 V (e.g., the cell is in the erased state or lower programmed state), the memory cell will be weakly programmed so that its Vth increases. If the Vth of the memory cell is more than 4 V (e.g., the cell is in a higher programmed state), the memory cell will be weakly erased so that its Vth decreases. The capacitor 1048 represents a memory cell after a significant amount of time has passed, e.g., an hour or more such that the word line has discharged to the first read condition.

When a data word line voltage floats, the amount of holes needed to charge up the channel is relatively small. As a result, the selected word line can be relatively quickly coupled up to about 4 V, for example. The potential on the selected word line remains at about 4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read condition will occur again.

Figure 11B:
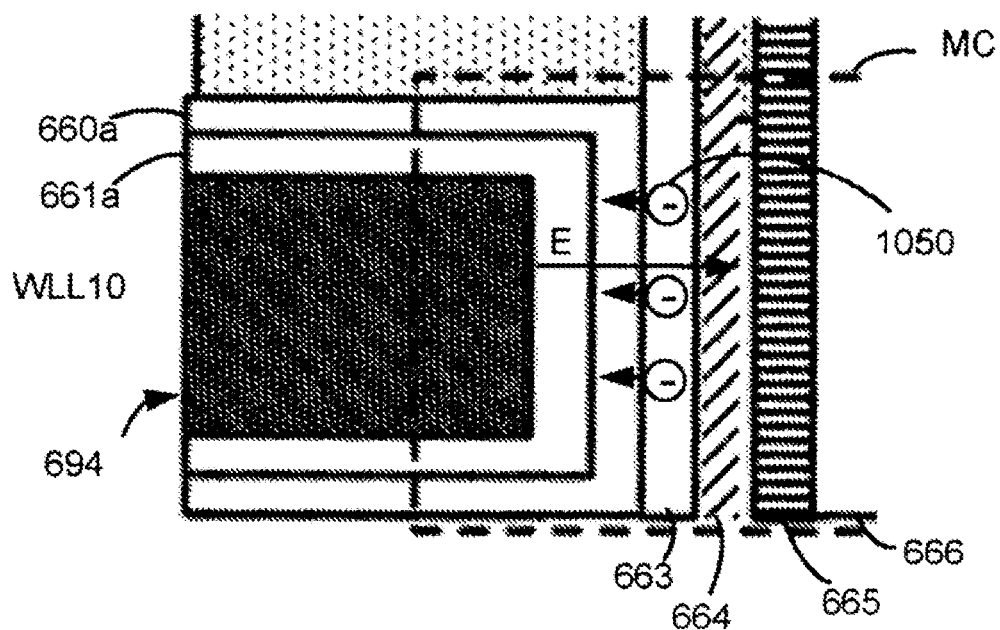
FIG. 11B depicts a portion of a memory cell, showing electron injection into a charge trapping region during weak programming according to aspects of the disclosure.

FIG. 11B depicts a portion of the memory cell MC of FIG. 6 showing electron injection into a charge trapping region during weak programming. The memory cell includes a control gate 694, a metal barrier 661*a*, a blocking oxide 660*a*, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps. A weak erasing similarly involves an electric field which repels electrons from the charge trapping layer, decreasing the threshold voltage Vth.

As discussed, the structure of the memory apparatus (e.g., BiCS) can result in a block being in the second read condition or state right after a read operation is performed (the word lines have a residual potential of ~4V). The duration for which the block remains in second read condition before the word line potential discharges or drops to 0V depending on factors including an amount of time elapsed. Data retention (DR) is one reliability bottleneck which often determines the upper limit of threshold voltage Vt widths for all the states right after programming. This is because, for a particular charge-loss over the maximum supported data retention time, if data retention specification are to be met, the memory apparatus cannot afford to have more than a certain threshold voltage Vt width right after programming. This in-turn affects the performance, since programming may need to be slowed down in order to maintain certain tightness in threshold voltage Vt distributions of various states. However, it is worth noting that the above explanation holds good for a fixed set of verify levels. If verify levels are adjusted, for the same threshold voltage Vt widths of each state, a different fail-bit count (FBC) for any page can be obtained. FIG. 12 shows threshold voltage distributions with different verify levels for two states in an example memory apparatus.

Figure 13:
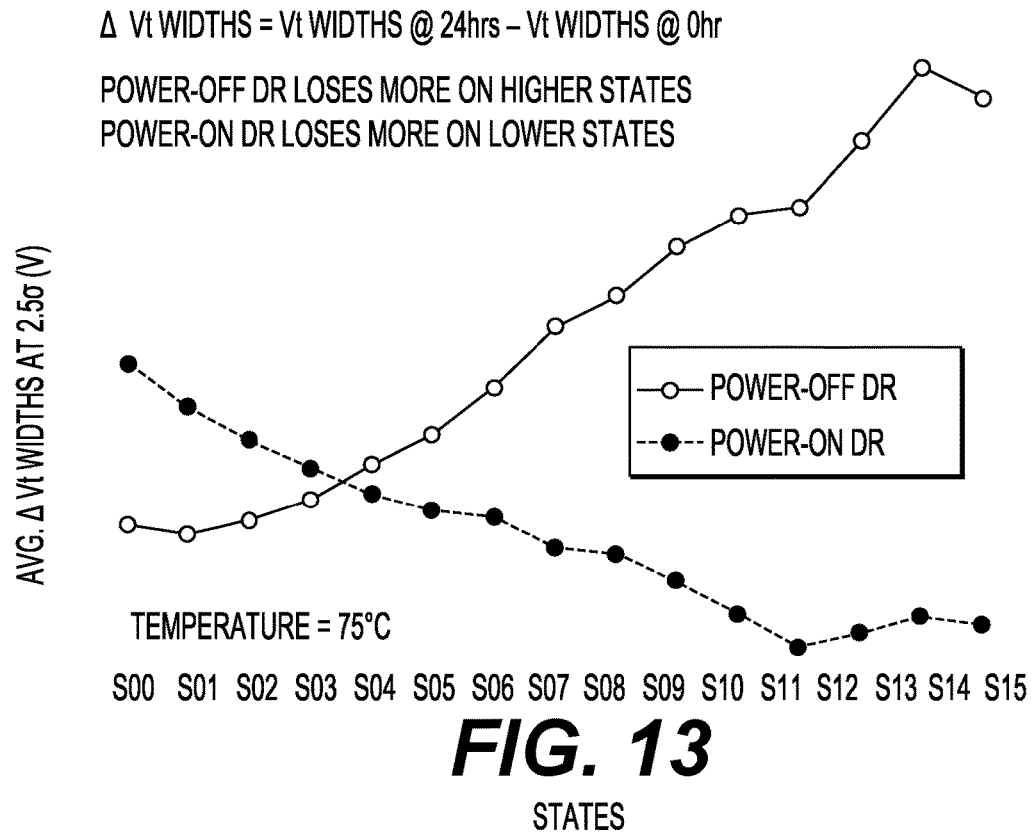
FIGS. 13 and 14 illustrate a difference in power-on and power-off data degradation due to data retention according to aspects of the disclosure.
Figure 14:
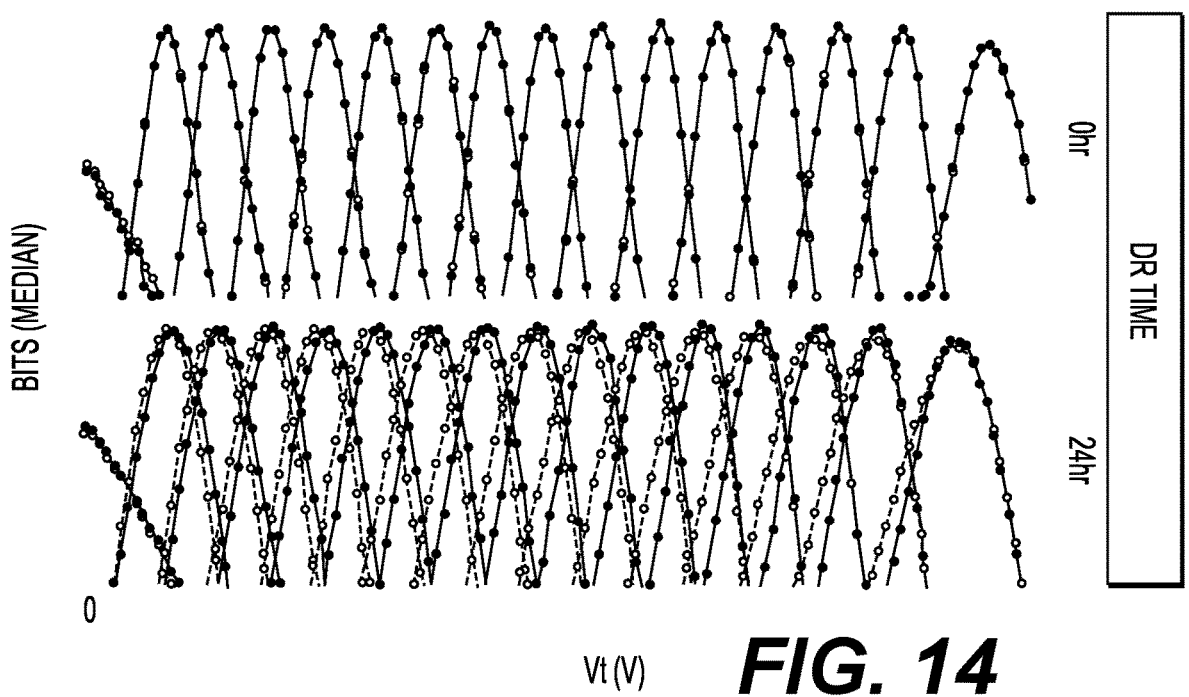

It has been observed that type of data retention (first read condition versus second read condition or power-off vs power-on) impacts the qualitative trend of state-dependence of data loss due to data retention. Furthermore, referring to FIGS. 13 and 14, it has been observed that the trend of data degradation due to data retention as a function of data states is different for power-on data retention than it is for power-off data retention. It should be noted that power-on data retention may also include regular refresh-reads to keep the word line potentials high (maintain the plurality of memory cells associated with the word line in the second read condition). Such a difference in power-on and power-off data degradation due to data retention is shown in FIGS. 13 and 14 (quad level cell (QLC) data), where threshold voltage Vt width degradation due to a data retention bake increases with threshold voltage Vt (i.e., higher states show larger increase in threshold voltage Vt widths during the data retention bake) for power-off data retention, while threshold voltage Vt width degradation due to data retention bake decreases with threshold voltage Vt (i.e., higher states show smaller increase in threshold voltage Vt widths during data retention bake) for power-on data retention. This means power-off data retention loses more on higher states, while power-on data retention loses more threshold voltage Vt width on lower states. In the data shown in FIGS. 13 and 14, verify levels for both power-on data retention and power-off data retention cases are tuned to overlap at PD (i.e., right after programming)(at 0 hr in the plots). Since widening of threshold voltage Vt distributions during data retention bake takes place more on higher states for power-off data retention and more on lower states for power-on data retention, failure bit counts after data retention depends on whether the verify levels during program verify operation are tuned for power-off data retention or for power-on data retention. This is explained by modifying the above data to illustrate the concept (see FIG. 15). Modifications involve horizontal shifting of states which assumes horizontal shift of threshold voltage Vt within 0.2 volts at PD will not impact the result of data retention bake on a memory cell. Data in FIGS. 13 and 14 already shows that this assumption is reasonable.

Figure 15:
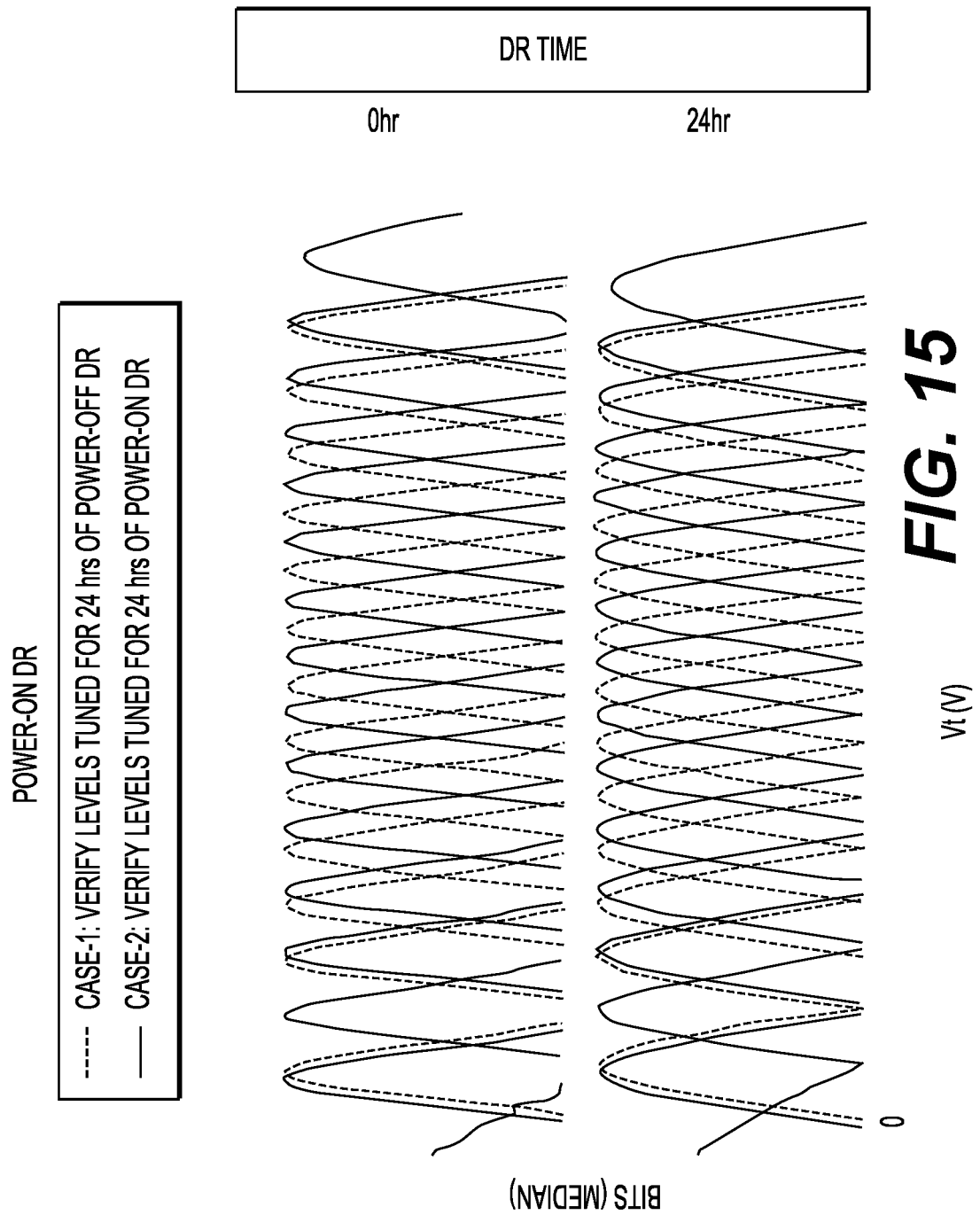
FIG. 15 illustrates two cases using different verify levels tuned for both power-on and power-off data retention according to aspects of the disclosure.

FIG. 15 illustrates two cases using different verify levels tuned for both power-on and power-off data retention. Specifically, for the first case, Case-1, verify levels during a program operation are tuned for power-off data retention, while the actual data retention is power-on data retention. For the second case, Case-2, verify levels during the program operation are tuned for power-on data retention, while the actual data retention is also power-on data retention. To compare the above cases, impact on the corresponding failure bit counts are estimated by counting a sum of the number of bits at various state cross-overs. Since the y-axis of threshold voltage Vt distributions is in the log scale, any linear shift in threshold voltage Vt crossover results in exponential variation in the number of bits at crossover. Estimation shows that tuning the verify level based on the kind of data retention performed results in a failure bit count benefit of up to 25% after data retention. Such a result is projected because if the verify levels are tuned for power-off data retention, higher states are expected to widen more. So, at PD, much more margin is left for higher states compared to lower states. Nevertheless, if the block undergoes power-on data retention, contrary to the expectation while tuning, lower states widen more than the higher states. As a result, higher crossover of states results and hence, higher failure bit count. Similar argument holds for the reverse case when the verify levels are tuned for power-on data retention, but blocks undergo power-off data retention. Therefore, it is desirable to tune or adjust the verify levels to match the real-use case.

Consequently, described herein is a memory apparatus (e.g., memory device 100 in FIG. 1A) including a plurality of memory cells (e.g., memory cell 200 in FIG. 1B). Each of the plurality of memory cells is connected to one of a plurality of word lines (e.g., WLL0-WLL10 in FIG. 4) and arranged in one of a plurality of blocks (e.g., BLK0, BLK1, BLK2 and BLK3 of FIG. 7B) and configured to retain a threshold voltage Vth corresponding to one of a plurality of data states (e.g., "Er", "A", "B", "C", "D", "E", "F" and "G" in FIG. 8A). The memory apparatus also includes a control circuit (e.g., control circuitry 110, controller 122, row decoder 124, read/write circuits 128, sense blocks 51, 52, 53, and column decoder 132 in FIG. 1A) coupled to the plurality of word lines and configured to detect at least one use characteristic of the memory apparatus. The control circuit is also configured to adjust a verify voltage by one of a plurality of verify level offsets based on the at least one use characteristic of the memory apparatus detected, the verify voltage applied to the one of the plurality of word lines selected for programming following an application of a program voltage during a program operation. Thus, by adjusting the verify levels based on the application, the failure bit count due to data retention is improved. In other words, if data retention failure bit count remains the same, shorter programming time (tprog) is provided.

The memory apparatus is operable in one of a power on state in which the memory apparatus is supplied with electrical power and a power off state in which the memory apparatus is not supplied with the electrical power. The plurality of verify level offsets include a plurality of power on verify level offsets each respectively associated with each of the plurality of data states and configured to minimize a fail-bit count following the program operation while the memory apparatus is maintained in the power on state. Similarly, the plurality of verify level offsets include a plurality of power off verify level offsets each respectively associated with each of the plurality of data states and configured to minimize the fail-bit count following the program operation while the memory apparatus is maintained in the power off state for a predetermined power off period of time. So, verify level offsets are provided for each state to switch between programming for power-off data retention and programming for power-on data retention. Accordingly, benefits of tuning verify levels for power-on data retention when the blocks undergo power-on data retention include a failure bit count benefit for 24 hours of data retention of approximately 5.3%. For a power-on data retention time of 114 hrs, assuming linear improvement, an estimated failure bit count benefit would be approximately 25%. So, different applications, employing different DR type can have different verify level tuning.

As discussed above, the plurality of memory cells are operable in one of a first read condition in which a word line voltage of the plurality of word lines is discharged and a second read condition in which the word line voltage of the plurality of word lines is coupled up (e.g., plot 1012 of FIG. 10A) to a residual voltage level (e.g., Vwl_coupled_up). Drives or memory apparatuses can be partitioned into two parts: (i) an active part, which gets regular refresh-read operations and (ii) a passive part, which remains idle and doesn't get regular refresh-read operations. As another embodiment of this, in a multi-die package, some dies can be set as active dies and other dies can be set as passive dies and passive dies can be kept in normally powered-off mode. This way, power-consumption can be minimized by avoiding read-refresh on blocks which are not frequently read. Thus, according to an aspect, the plurality of memory cells are partitioned into an active subset of the plurality of memory cells continuously supplied with the electrical power and a passive subset of the plurality of memory cells not continuously supplied with the electrical power. The at least one use characteristic of the memory apparatus may include an active and passive status of the plurality of memory cells. The control circuit is further configured to periodically apply a predetermined refresh read voltage to a selected one of the plurality of word lines for a predetermined period of time for each of the plurality of memory cells of the active subset at a specified interval to maintain the plurality of memory cells of the active subset in the second read condition (i.e., a refresh read operation). The control circuit is also configured to adjust the verify voltage by one of the plurality of power on verify level offsets for the program operation of the plurality of memory cells of the active subset. The control circuit then adjusts the verify voltage by one of the plurality of power off verify level offsets for the program operation of the plurality of memory cells of the passive subset. So, for any programming on the active part, power-on data retention verify levels are used, whereas for any programming on the passive part, power-off data retention verify levels are used (this is primarily because, the main difference-maker which changes the above-described data retention trends between power-on data retention and power-off data retention is the refresh read operation).

According to an aspect, any incoming data to such a memory apparatus in which the plurality of memory cells are partitioned the active and passive subsets is initially programmed on the passive part or subset. The control circuit may be configured to detect the blocks that are read frequently (i.e., 'hot' logical block addresses (LBA) or physical block addresses (PBA)). For data written on such blocks, during their first data scrub and reprogram/transfer operation, data is transferred to a block in the active subset of the memory apparatus. While doing this data transfer, verify levels for power-on data retention are used as mentioned above. Thus, the control circuit is further configured to receive an incoming data to be programmed. In addition, the control circuit is configured to program the incoming data to the plurality of blocks of the passive subset of the plurality of memory cells. The control circuit is also configured to detect whether one or more of the plurality of blocks of the passive subset are read with a read frequency greater than a predetermined read frequency threshold. The control circuit is additionally configured to transfer the one or more of the plurality of blocks of the passive subset to the active subset in a reprogram operation in response to the one or more of the plurality of blocks of the passive subset being read with the read frequency greater than the predetermined read frequency threshold, the verify voltage used for the reprogram operation being adjusted by one the plurality of power on verify level offsets.

For certain applications involving client storage solutions (CSS), industrial NAND (iNAND) and retail applications, total times the memory apparatuses remain in power-on or power-off conditions (or even active or passive conditions) depend on an outside environment controlling the memory apparatus or NAND (e.g., user). Based on this user behavior, the memory apparatus can detect whether the power-on time dominates or power-off time dominates or both are similar.

Power-on times can be tracked by the control circuit (e.g., timer 113a) and power-off times can be indirectly tracked by various methods, such as based on the failure bit counts after data retention during the detection period. Thus, the at least one use characteristic of the memory apparatus can also include an amount of time the plurality of memory cells are supplied with the electrical power. So, the control circuit is configured to determine and record a power on time in which the memory apparatus is supplied with the electrical power and a power off time in which the memory apparatus is not supplied with the electrical power. The control circuit is also configured to determine whether the power on time is greater than the power off time. The control circuit adjusts the verify voltage by one of the plurality of power on verify level offsets for the program operation of the plurality of memory cells in response to the power on time being greater than the power off time. The control circuit is also configured to adjust the verify voltage by one of the plurality of power off verify level offsets for the program operation of the plurality of memory cells in response to the power on time not being greater than the power off time. So, if power-on time dominates, verify levels are tuned for power-on data retention. If power-off time dominates, the verify levels are tuned for power-off data retention. According to an aspect, this can be dynamically changed with the change in user behavior. This can be selectively done on a few/one cycling condition susceptible to data retention loss and not meeting specs.

As discussed above, the control circuit further includes an error-correction code engine configured to determine and correct errors in reading the plurality of memory cells. In addition, the control circuit is further configured to read at least a subset of the plurality of memory cells. The control circuit determines a failure bit count for the at least the subset of the plurality of memory cells using the error-correction code engine. The control circuit is also configured to estimate the power off time based on the failure bit count.

If both power off and power on times are similar, another verify level (in-between power-on and power-off case) can be used. So, according to another aspect, the plurality of verify level offsets include a plurality of intermediate power verify level offsets each respectively associated with each of the plurality of data states and having a magnitude in between the plurality of power on verify level offsets and the plurality of power off verify level offsets. Thus, the control circuit is further configured to determine a ratio of the power on time and the power off time or determine a power on off delta time difference between the power on time and the power off time. The control circuit is also configured to determine whether the ratio or the power on off delta time is less than a corresponding threshold in ratio or time (i.e., threshold of the ratio of the power on time and the power off time or threshold of the power on off delta time). Additionally, the control circuit is configured to adjust the verify voltage by one of the plurality of intermediate power verify level offsets for the program operation of the plurality of memory cells in response to the ratio of the power on time and the power off time or power on off delta time being less than the corresponding threshold in ratio or time.

As an example, memory apparatuses used for enterprise storage solutions (ESS) are typically powered on most of the times. So, on all ESS apparatuses, power-on data retention verify levels can be used as the default. On the contrary, for the customers/applications where the memory cells are routinely powered on for a while, and then kept powered off for a long period of time, verify levels can be tuned for power-off data retention. Therefore, the at least one use characteristic of the memory apparatus includes a designated use of the memory apparatus. In addition, the memory apparatus further includes a storage region (e.g., storage region 113) in communication with the control circuit and storing a predetermined use designation corresponding with the designated use of the memory apparatus and associated with one of the plurality of power off verify level offsets and the plurality of power on verify level offsets. So, the control circuit is further configured to read the predetermined use designation stored in the storage region. The control circuit then adjusts the verify voltage by the one of the plurality of power off verify level offsets and the plurality of power on verify level offsets for the program operation of the plurality of memory cells based on the predetermined use designation stored in the storage region.

Figure 16:
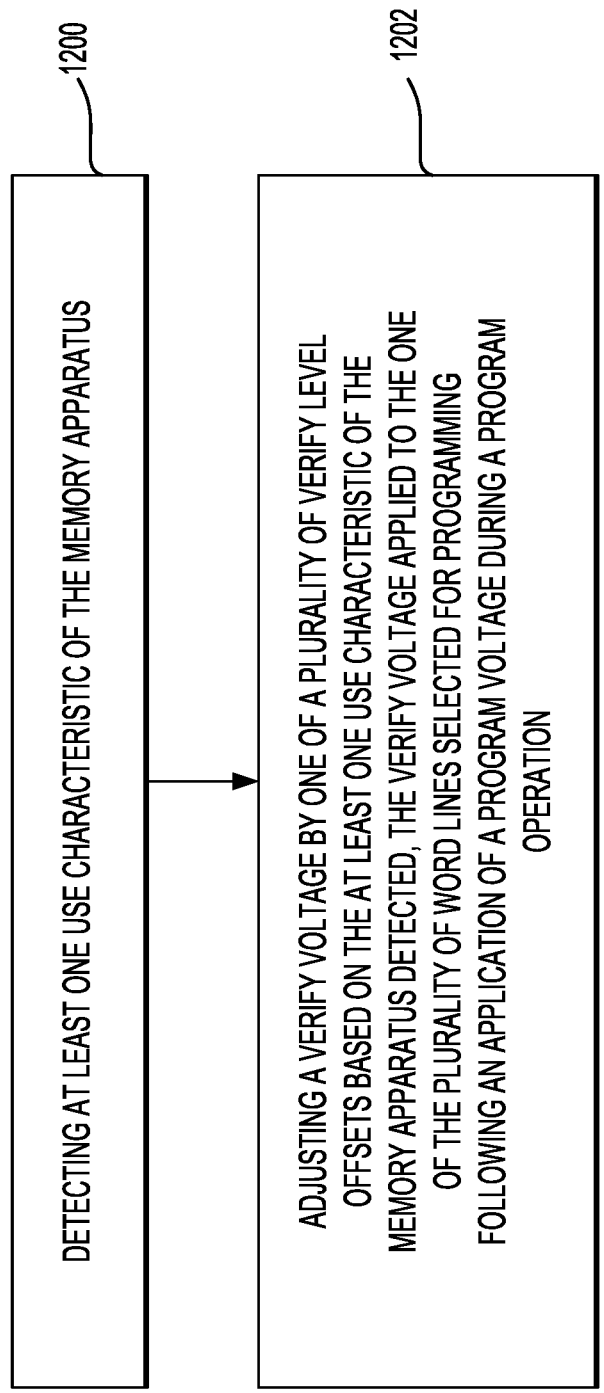
FIG. 16 illustrates steps of a method of operating a memory apparatus according to aspects of the disclosure.

Now referring to FIG. 16, a method of operating a memory apparatus is also provided. As discussed above, the memory apparatus includes a plurality of memory cells. Each of the plurality of memory cells is connected to one of a plurality of word lines and arranged in one of a plurality of blocks and configured to retain a threshold voltage corresponding to one of a plurality of data states. The method includes the step of 1200 detecting at least one use characteristic of the memory apparatus. The method continues with the step of 1202 adjusting a verify voltage by one of a plurality of verify level offsets based on the at least one use characteristic of the memory apparatus detected, the verify voltage applied to the one of the plurality of word lines selected for programming following an application of a program voltage during a program operation.

Again, the memory apparatus is operable in one of a power on state in which the memory apparatus is supplied with electrical power and a power off state in which the memory apparatus is not supplied with the electrical power. The plurality of verify level offsets include a plurality of power on verify level offsets each respectively associated with each of the plurality of data states and configured to minimize a fail-bit count following the program operation while the memory apparatus is maintained in the power on state. The plurality of verify level offsets include a plurality of power off verify level offsets each respectively associated with each of the plurality of data states and configured to minimize the fail-bit count following the program operation while the memory apparatus is maintained in the power off state for a predetermined power off period of time.

The plurality of memory cells are operable in one of a first read condition in which a word line voltage of the plurality of word lines is discharged and a second read condition in which the word line voltage of the plurality of word lines is coupled up to a residual voltage level, the plurality of memory cells are partitioned into an active subset of the plurality of memory cells continuously supplied with the electrical power and a passive subset of the plurality of memory cells not continuously supplied with the electrical power, the at least one use characteristic of the memory apparatus includes an active and passive status of the plurality of memory cells. Thus, the method further includes the step of periodically applying a predetermined refresh read voltage to a selected one of the plurality of word lines for a predetermined period of time for each of the plurality of memory cells of the active subset at a specified interval to maintain the plurality of memory cells of the active subset in the second read condition. The method proceeds by adjusting the verify voltage by one of the plurality of power on verify level offsets for the program operation of the plurality of memory cells of the active subset. The next step of the method is adjusting the verify voltage by one of the plurality of power off verify level offsets for the program operation of the plurality of memory cells of the passive subset.

The method also includes the steps of receiving an incoming data to be programmed and programming the incoming data to the plurality of blocks of the passive subset of the plurality of memory cells. The next step of the method is detecting whether one or more of the plurality of blocks of the passive subset are read with a read frequency greater than a predetermined read frequency threshold. The method continues by transferring the one or more of the plurality of blocks of the passive subset to the active subset in a reprogram operation in response to the one or more of the plurality of blocks of the passive subset being read with the read frequency greater than the predetermined read frequency threshold, the verify voltage used for the reprogram operation being adjusted by one the plurality of power on verify level offsets.

As discussed, the at least one use characteristic of the memory apparatus includes an amount of time the plurality of memory cells are supplied with the electrical power. So, the method further includes the step of determining and recording a power on time in which the memory apparatus is supplied with the electrical power and a power off time in which the memory apparatus is not supplied with the electrical power. The method continues with the step of determining whether the power on time is greater than the power off time. Next, adjusting the verify voltage by one of the plurality of power on verify level offsets for the program operation of the plurality of memory cells in response to the power on time being greater than the power off time. The method also includes the step of adjusting the verify voltage by one of the plurality of power off verify level offsets for the program operation of the plurality of memory cells in response to the power on time not being greater than the power off time.

The memory apparatus further includes an error-correction code engine configured to determine and correct errors in reading the plurality of memory cells. Consequently, the method further includes the steps of reading at least a subset of the plurality of memory cells and determining a failure bit count for the at least the subset of the plurality of memory cells using the error-correction code engine. The next step of the method is estimating the power off time based on the failure bit count.

As discussed, the plurality of verify level offsets include a plurality of intermediate power verify level offsets each respectively associated with each of the plurality of data states and having a magnitude in between the plurality of power on verify level offsets and the plurality of power off verify level offsets. Thus, the method further includes the step of determining a power on off delta time difference between the power on time and the power off time. Next, determining whether the ratio of the power on time and the power off time or the power on off delta time is less than a corresponding threshold in ratio or time (i.e., threshold of the ratio of the power on time and the power off time or threshold of the power on off delta time). The method continues with the step of adjusting the verify voltage by one of the plurality of intermediate power verify level offsets for the program operation of the plurality of memory cells in response to the ratio of the power on time and the power off time or the power on off delta time being less than the corresponding threshold in ratio or time.

Again, the at least one use characteristic of the memory apparatus includes a designated use of the memory apparatus. In addition, the memory apparatus further includes a storage region (e.g., storage region 113) storing a predetermined use designation corresponding with the designated use of the memory apparatus and associated with one of the plurality of power off verify level offsets and the plurality of power on verify level offsets. So, the method further includes the step of reading the predetermined use designation stored in the storage region. The next step of the method is adjusting the verify voltage by the one of the plurality of power off verify level offsets and the plurality of power on verify level offsets for the program operation of the plurality of memory cells based on the predetermined use designation stored in the storage region.

The memory apparatus and methods disclosed herein provide numerous advantages. Fail bit counts (FBC) due to data retention are reduced to provide up to a 25% improvement and therefore provide a market advantage. If current data retention FBC can be tolerated, performance (tprog) can be improved. In addition, for example, dynamic switching of verify levels based on system detection (i.e., memory apparatus with active and passive subsets of memory cells) improves both data retention (DR) and power consumption.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   a plurality of memory cells, each of the plurality of memory cells connected to one of a plurality of word lines and arranged in one of a plurality of blocks and configured to retain a threshold voltage corresponding to one of a plurality of data states; and
   a control circuit coupled to the plurality of word lines and configured to:
   detect at least one use characteristic of the memory apparatus, the at least one use characteristic including whether the memory apparatus is maintained in a power on state or a power off state, and
   adjust a verify voltage by one of a plurality of power on verify level offsets in response to the memory apparatus being maintained in the power on state and adjust the verify voltage by one of a plurality of power off verify level offsets in response to the memory apparatus being maintained in the power off state for a predetermined power off period of time, the verify voltage applied to the one of the plurality of word lines selected for programming following an application of a program voltage during a program operation.

2. The memory apparatus as set forth in claim 1, wherein the plurality of memory cells are operable in one of a first read condition in which a word line voltage of the plurality of word lines is discharged and a second read condition in which the word line voltage of the plurality of word lines is coupled up to a residual voltage level, the plurality of memory cells are partitioned into an active subset of the plurality of memory cells continuously supplied with the electrical power and a passive subset of the plurality of memory cells not continuously supplied with the electrical power, the at least one use characteristic of the memory apparatus includes an active and passive status of the plurality of memory cells, and the control circuit is further configured to:
   periodically apply a predetermined refresh read voltage to a selected one of the plurality of word lines for a predetermined period of time for each of the plurality of memory cells of the active subset at a specified interval to maintain the plurality of memory cells of the active subset in the second read condition;
   adjust the verify voltage by one of the plurality of power on verify level offsets for the program operation of the plurality of memory cells of the active subset; and
   adjust the verify voltage by one of the plurality of power off verify level offsets for the program operation of the plurality of memory cells of the passive subset.

3. The memory apparatus as set forth in claim 2, wherein the control circuit is further configured to:
   receive an incoming data to be programmed;
   program the incoming data to the plurality of blocks of the passive subset of the plurality of memory cells;
   detect whether one or more of the plurality of blocks of the passive subset are read with a read frequency greater than a predetermined read frequency threshold; and
   transfer the one or more of the plurality of blocks of the passive subset to the active subset in a reprogram operation in response to the one or more of the plurality of blocks of the passive subset being read with the read frequency greater than the predetermined read frequency threshold, the verify voltage used for the reprogram operation being adjusted by one the plurality of power on verify level offsets.

4. The memory apparatus as set forth in claim 1, the at least one use characteristic of the memory apparatus includes an amount of time the plurality of memory cells are supplied with the electrical power, and the control circuit is further configured to:
   determine and record a power on time in which the memory apparatus is supplied with the electrical power and a power off time in which the memory apparatus is not supplied with the electrical power;
   determine whether the power on time is greater than the power off time;
   adjust the verify voltage by one of the plurality of power on verify level offsets for the program operation of the plurality of memory cells in response to the power on time being greater than the power off time; and
   adjust the verify voltage by one of the plurality of power off verify level offsets for the program operation of the plurality of memory cells in response to the power on time not being greater than the power off time.

5. The memory apparatus as set forth in claim 4, wherein the control circuit further includes an error-correction code engine configured to determine and correct errors in reading the plurality of memory cells, and the control circuit is further configured to:
   read at least a subset of the plurality of memory cells;
   determine a failure bit count for the at least the subset of the plurality of memory cells using the error-correction code engine; and
   estimate the power off time based on the failure bit count.

6. The memory apparatus as set forth in claim 4, wherein the plurality of verify level offsets include a plurality of intermediate power verify level offsets each respectively associated with each of the plurality of data states and having a magnitude in between the plurality of power on verify level offsets and the plurality of power off verify level offsets, and the control circuit is further configured to:

determine the ratio of the power on time and the power off time or determine a power on off delta time difference between the power on time and the power off time;

determine whether the ratio of the power on time and the power off time or the power on off delta time is less than a corresponding threshold in ratio or time; and adjust the verify voltage by one of the plurality of intermediate power verify level offsets for the program operation of the plurality of memory cells in response to the ratio of the power on time and the power off time or the power on off delta time being less than the corresponding threshold in ratio or time.

7. The memory apparatus as set forth in claim 1, wherein the at least one use characteristic of the memory apparatus includes a designated use of the memory apparatus, the memory apparatus further including a storage region in communication with the control circuit and storing a predetermined use designation corresponding with the designated use of the memory apparatus and associated with one of the plurality of power off verify level offsets and the plurality of power on verify level offsets, and the control circuit is further configured to:

read the predetermined use designation stored in the storage region; and adjust the verify voltage by the one of the plurality of power off verify level offsets and the plurality of power on verify level offsets for the program operation of the plurality of memory cells based on the predetermined use designation stored in the storage region.

8. A controller in communication with a memory apparatus including a plurality of memory cells, each of the plurality of memory cells connected to one of a plurality of word lines and arranged in one of a plurality of blocks and configured to retain a threshold voltage corresponding to one of a plurality of data states, the controller configured to:

detect at least one use characteristic of the memory apparatus, the at least one use characteristic including whether the memory apparatus is maintained in a power on state or a power off state; and adjust a verify voltage by one of a plurality of power on verify level offsets in response to the memory apparatus being maintained in the power on state and adjust the verify voltage by one of a plurality of power off verify level offsets in response to the memory apparatus being maintained in the power off state, the verify voltage applied to the one of the plurality of word lines selected for programming following an application of a program voltage during a program operation.

9. The controller as set forth in claim 8, wherein the plurality of memory cells are operable in one of a first read condition in which a word line voltage of the plurality of word lines is discharged and a second read condition in which the word line voltage of the plurality of word lines is coupled up to a residual voltage level, the plurality of memory cells are partitioned into an active subset of the plurality of memory cells continuously supplied with the electrical power and a passive subset of the plurality of memory cells not continuously supplied with the electrical power, the at least one use characteristic of the memory apparatus includes an active and passive status of the plurality of memory cells, and the controller is further configured to:

instruct the memory apparatus to periodically apply a predetermined refresh read voltage to a selected one of the plurality of word lines for a predetermined period of time for each of the plurality of memory cells of the active subset at a specified interval to maintain the plurality of memory cells of the active subset in the second read condition;

instruct the memory apparatus to adjust the verify voltage by one of the plurality of power on verify level offsets for the program operation of the plurality of memory cells of the active subset; and instruct the memory apparatus to adjust the verify voltage by one of the plurality of power off verify level offsets for the program operation of the plurality of memory cells of the passive subset.

10. The controller as set forth in claim 8, the at least one use characteristic of the memory apparatus includes an amount of time the plurality of memory cells are supplied with the electrical power, and the controller is further configured to:

determine and record a power on time in which the memory apparatus is supplied with the electrical power and a power off time in which the memory apparatus is not supplied with the electrical power;

determine whether the power on time is greater than the power off time;

instruct the memory apparatus to adjust the verify voltage by one of the plurality of power on verify level offsets for the program operation of the plurality of memory cells in response to the power on time being greater than the power off time; and instruct the memory apparatus to adjust the verify voltage by one of the plurality of power off verify level offsets for the program operation of the plurality of memory cells in response to the power on time not being greater than the power off time.

11. A method of operating a memory apparatus including a plurality of memory cells, each of the plurality of memory cells connected to one of a plurality of word lines and arranged in one of a plurality of blocks and configured to retain a threshold voltage corresponding to one of a plurality of data states, the method comprising the steps of:

detecting at least one use characteristic of the memory apparatus, the at least one use characteristic including whether the memory apparatus is maintained in a power on state or a power off state; and adjusting a verify voltage by one of a plurality of power on verify level offsets in response to the memory apparatus being maintained in the power on state or adjusting the verify voltage by one of a plurality of power off verify level offsets in response to the memory apparatus being maintained in the power off state, the verify voltage applied to the one of the plurality of word lines selected for programming following an application of a program voltage during a program operation.

12. The method as set forth in claim 11, wherein the plurality of memory cells are operable in one of a first read condition in which a word line voltage of the plurality of word lines is discharged and a second read condition in which the word line voltage of the plurality of word lines is coupled up to a residual voltage level, the plurality of memory cells are partitioned into an active subset of the plurality of memory cells continuously supplied with the electrical power and a passive subset of the plurality of memory cells not continuously supplied with the electrical power, the at least one use characteristic of the memory apparatus includes an active and passive status of the plurality of memory cells, and the method further includes the steps of:

periodically applying a predetermined refresh read voltage to a selected one of the plurality of word lines for a predetermined period of time for each of the plurality of memory cells of the active subset at a specified interval to maintain the plurality of memory cells of the active subset in the second read condition;

adjusting the verify voltage by one of the plurality of power on verify level offsets for the program operation of the plurality of memory cells of the active subset; and adjusting the verify voltage by one of the plurality of power off verify level offsets for the program operation of the plurality of memory cells of the passive subset.

13. The method as set forth in claim 12, further including the steps of:

receiving an incoming data to be programmed;

programming the incoming data to the plurality of blocks of the passive subset of the plurality of memory cells;

detecting whether one or more of the plurality of blocks of the passive subset are read with a read frequency greater than a predetermined read frequency threshold; and transferring the one or more of the plurality of blocks of the passive subset to the active subset in a reprogram operation in response to the one or more of the plurality of blocks of the passive subset being read with the read frequency greater than the predetermined read frequency threshold, the verify voltage used for the reprogram operation being adjusted by one the plurality of power on verify level offsets.

14. The method as set forth in claim 11, the at least one use characteristic of the memory apparatus includes an amount of time the plurality of memory cells are supplied with the electrical power, and the method further includes the steps of:

determining and recording a power on time in which the memory apparatus is supplied with the electrical power and a power off time in which the memory apparatus is not supplied with the electrical power;

determining whether the power on time is greater than the power off time;

adjusting the verify voltage by one of the plurality of power on verify level offsets for the program operation of the plurality of memory cells in response to the power on time being greater than the power off time; and adjusting the verify voltage by one of the plurality of power off verify level offsets for the program operation of the plurality of memory cells in response to the power on time not being greater than the power off time.

15. The method as set forth in claim 14, wherein the memory apparatus further includes an error-correction code engine configured to determine and correct errors in reading the plurality of memory cells, and the method further includes the steps of:

reading at least a subset of the plurality of memory cells;

determining a failure bit count for the at least the subset of the plurality of memory cells using the error-correction code engine; and estimating the power off time based on the failure bit count.

16. The method as set forth in claim 14, wherein the plurality of verify level offsets include a plurality of intermediate power verify level offsets each respectively associated with each of the plurality of data states and having a magnitude in between the plurality of power on verify level offsets and the plurality of power off verify level offsets, and the method further includes the steps of:

determining a ratio of the power on time and the power off time or a power on off delta time difference between the power on time and the power off time;

determining whether the ratio of the power on time and the power off time or the power on off delta time is less than a corresponding threshold in ratio or time; and adjusting the verify voltage by one of the plurality of intermediate power verify level offsets for the program operation of the plurality of memory cells in response to the ratio of the power on time and the power off time or the power on off delta time being less than the corresponding threshold in ratio or time.

17. The method as set forth in claim 11, wherein the at least one use characteristic of the memory apparatus includes a designated use of the memory apparatus, the memory apparatus further including a storage region storing a predetermined use designation corresponding with the designated use of the memory apparatus and associated with one of the plurality of power off verify level offsets and the plurality of power on verify level offsets, and the method further includes the steps of:

reading the predetermined use designation stored in the storage region; and adjusting the verify voltage by the one of the plurality of power off verify level offsets and the plurality of power on verify level offsets for the program operation of the plurality of memory cells based on the predetermined use designation stored in the storage region.

* * * * *